US012418309B2

(12) United States Patent
Kodama et al.

(10) Patent No.: US 12,418,309 B2
(45) Date of Patent: Sep. 16, 2025

(54) CODE TABLE GENERATION DEVICE, MEMORY SYSTEM, AND CODE TABLE GENERATION METHOD

(71) Applicant: Kioxia Corporation, Tokyo (JP)

(72) Inventors: Sho Kodama, Yokohama Kanagawa (JP); Masato Sumiyoshi, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 182 days.

(21) Appl. No.: 18/244,621

(22) Filed: Sep. 11, 2023

(65) Prior Publication Data
US 2024/0204796 A1 Jun. 20, 2024

(30) Foreign Application Priority Data

Dec. 14, 2022 (JP) .................... 2022-199535

(51) Int. Cl.
H03M 7/40 (2006.01)
(52) U.S. Cl.
CPC ......... H03M 7/405 (2013.01); H03M 7/4056 (2013.01)
(58) Field of Classification Search
CPC ....... H03M 7/40; H03M 7/405; H03M 7/4056
See application file for complete search history.

(56) References Cited

U.S. PATENT DOCUMENTS

| 7,609,182 | B2* | 10/2009 | Owsley ................ H03M 7/40 341/51 |
| 9,584,156 | B1 | 2/2017 | Abali et al. |
| 10,135,463 | B1 | 11/2018 | Satpathy et al. |
| 10,693,493 | B1* | 6/2020 | Abali ................ H03M 7/3086 |
| 10,756,758 | B1* | 8/2020 | Abali ................ H03M 7/3077 |
| 12,081,241 | B2* | 9/2024 | Kodama ............. H03M 7/3079 |
| 2008/0240596 | A1* | 10/2008 | Haque ..................... H03M 7/40 382/246 |
| 2010/0088687 | A1* | 4/2010 | Choi .................... H04N 19/436 711/170 |
| 2011/0109485 | A1* | 5/2011 | Kataoka ................ H03M 7/40 341/65 |

(Continued)

FOREIGN PATENT DOCUMENTS

| JP | 4195472 B2 | 12/2008 |
| JP | 6681313 B2 | 4/2020 |

OTHER PUBLICATIONS

Van Leeuwen, Jan, "On the Construction of Huffman Trees", International Colloquium on Automata, Languages and Programming (ICALP), 1976, pp. 382-410.

*Primary Examiner* — Lam T Mai
(74) *Attorney, Agent, or Firm* — Maier & Maier, PLLC

(57) ABSTRACT

According to one embodiment, a code table generation device includes a frequency table generation unit, a frequency sorting unit, and a Huffman tree generation unit. The frequency table generation unit generates a frequency table including entries each including a symbol and a frequency of occurrence, based on a frequency of occurrence for each symbol of input symbols. The frequency sorting unit sorts the entries in the frequency table by frequency of occurrence. The Huffman tree generation unit generates a Huffman tree having leaf nodes by using a queue that includes storage areas in which the sorted entries are respectively stored as the leaf nodes in an initial state, in response to the entries having been sorted.

15 Claims, 18 Drawing Sheets

(56) References Cited

U.S. PATENT DOCUMENTS

| | | | |
|---|---|---|---|
| 2021/0250043 A1* | 8/2021 | Oikawa | H03M 7/70 |
| 2021/0288662 A1* | 9/2021 | Fukazawa | H03M 7/40 |
| 2022/0294469 A1* | 9/2022 | Kodama | G06F 3/0659 |
| 2022/0398019 A1* | 12/2022 | Fukazawa | G06F 3/0679 |
| 2023/0081961 A1* | 3/2023 | Kodama | G06F 3/0679 |
| | | | 711/103 |
| 2023/0086658 A1* | 3/2023 | Wang | H03M 7/4093 |
| | | | 341/67 |
| 2023/0283294 A1* | 9/2023 | Fukazawa | H03M 7/3084 |
| | | | 341/51 |
| 2023/0283295 A1* | 9/2023 | Kodama | H03M 7/3077 |
| | | | 341/65 |
| 2023/0291418 A1* | 9/2023 | Sumiyoshi | H03M 7/4037 |

* cited by examiner

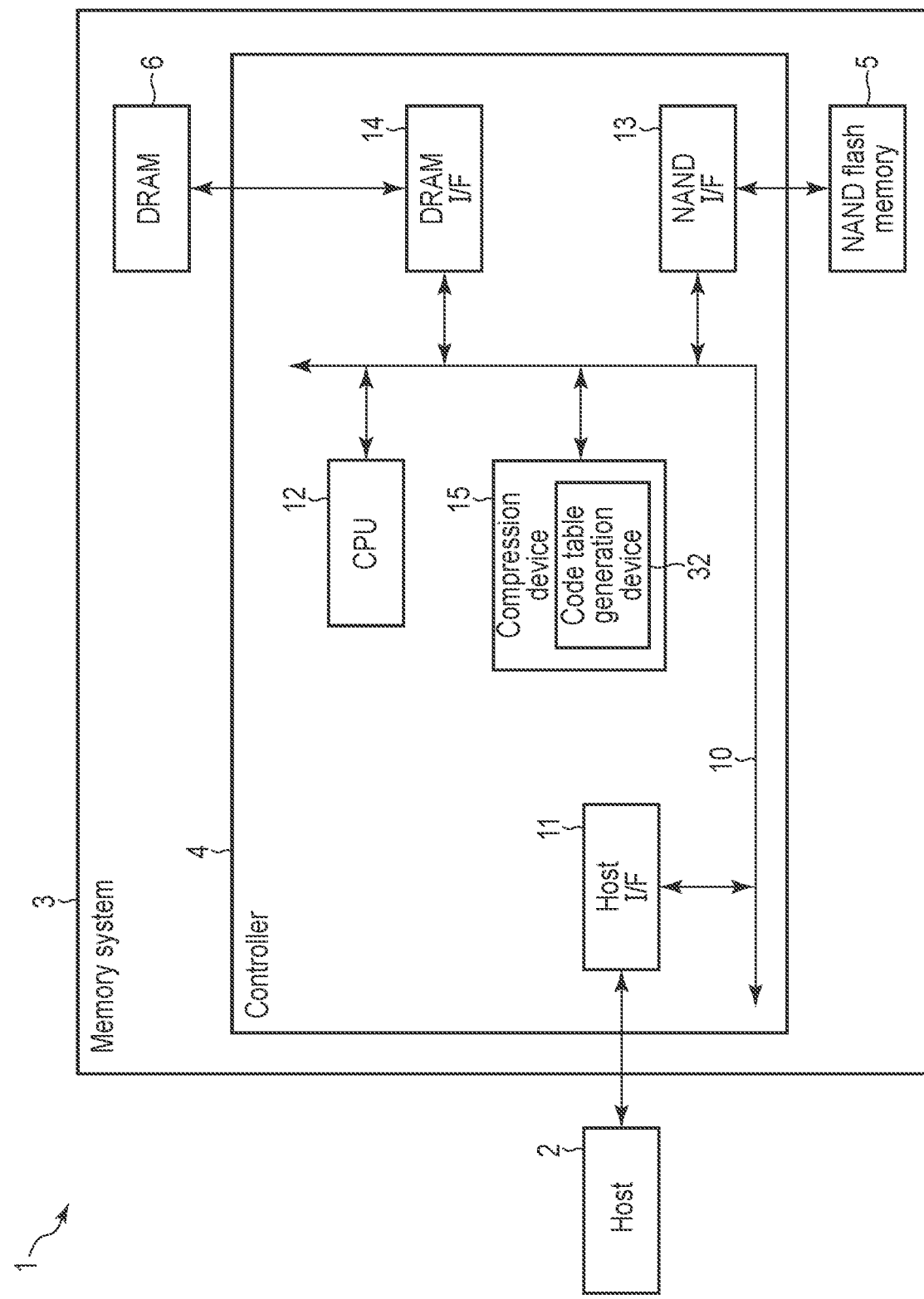
F I G. 1

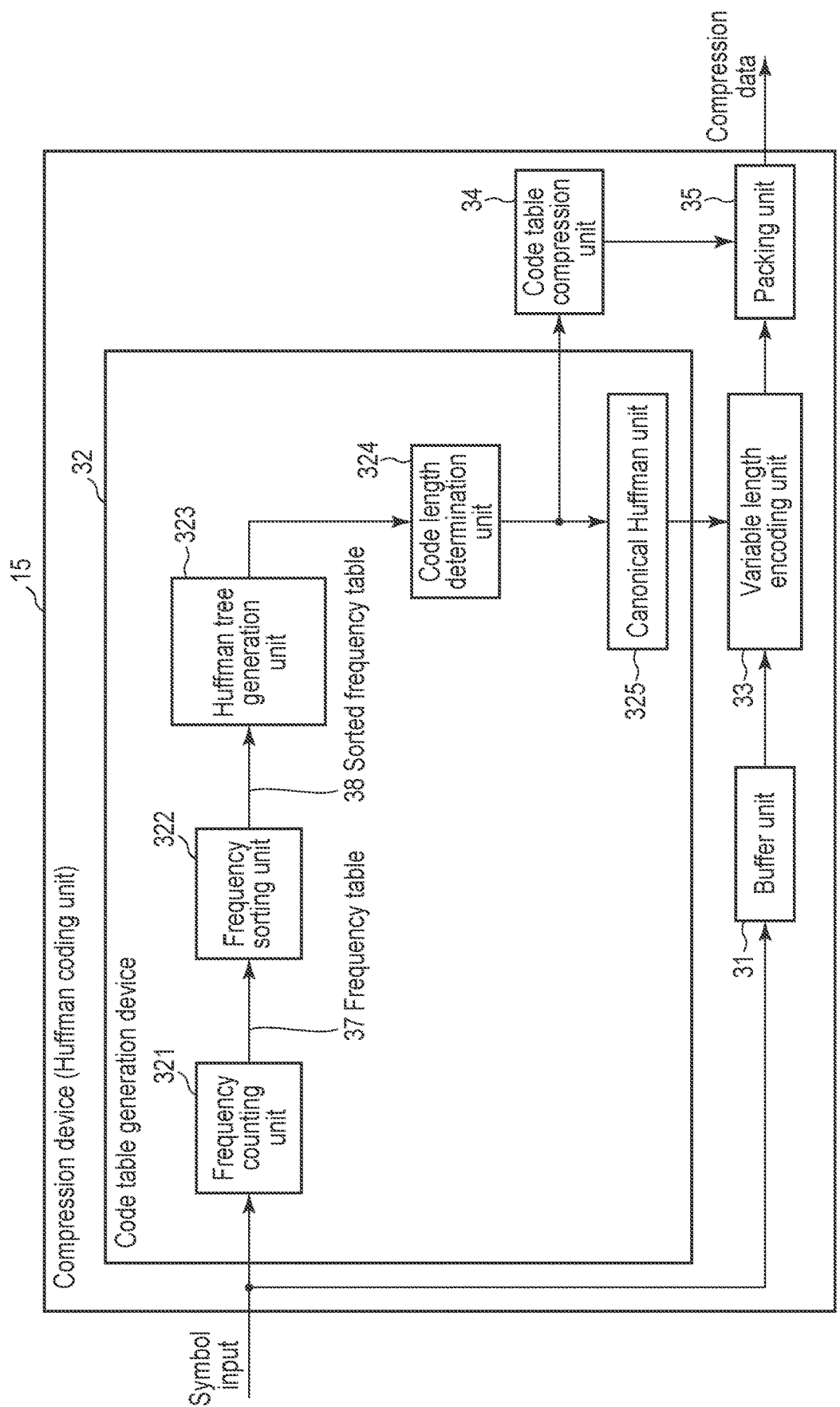
F I G. 2

| Symbol | Frequency of occurrence |
|---|---|
| a | 3 |
| b | 5 |
| c | 1 |
| d | 1 |
| ... | ... |
| A | 8 |
| B | 11 |
| C | 20 |
| ... | ... |
| ... | ... |
| ... | ... | e.g., 286 symbols (in case of deflate)

F I G. 3

| Symbol | Frequency of occurrence |
|---|---|
| c | 1 |
| d | 1 |
| a | 3 |
| b | 5 |
| ... | ... |
| A | 8 |
| B | 11 |
| C | 20 |
| ... | ... |
| ... | ... |
| ... | ... | e.g., 286 symbols (in case of deflate)

F I G. 4

| Symbol | Code length |
|---|---|
| C | 1 |
| B | 2 |
| A | 3 |
| ... | ... |
| ... | ... |
| b | 5 |
| a | 6 |
| c | 8 |
| d | 8 |
| ... | ... |
| ... | ... |

F I G. 5

```
code:=0
while more symbols do //assign in ascending code length order and in predetermined
symbol order in case of same code length
    code bit string of symbol = code
    code:=(code+1) << ((bit length of next symbol) - (current bit length))
```

F I G. 6

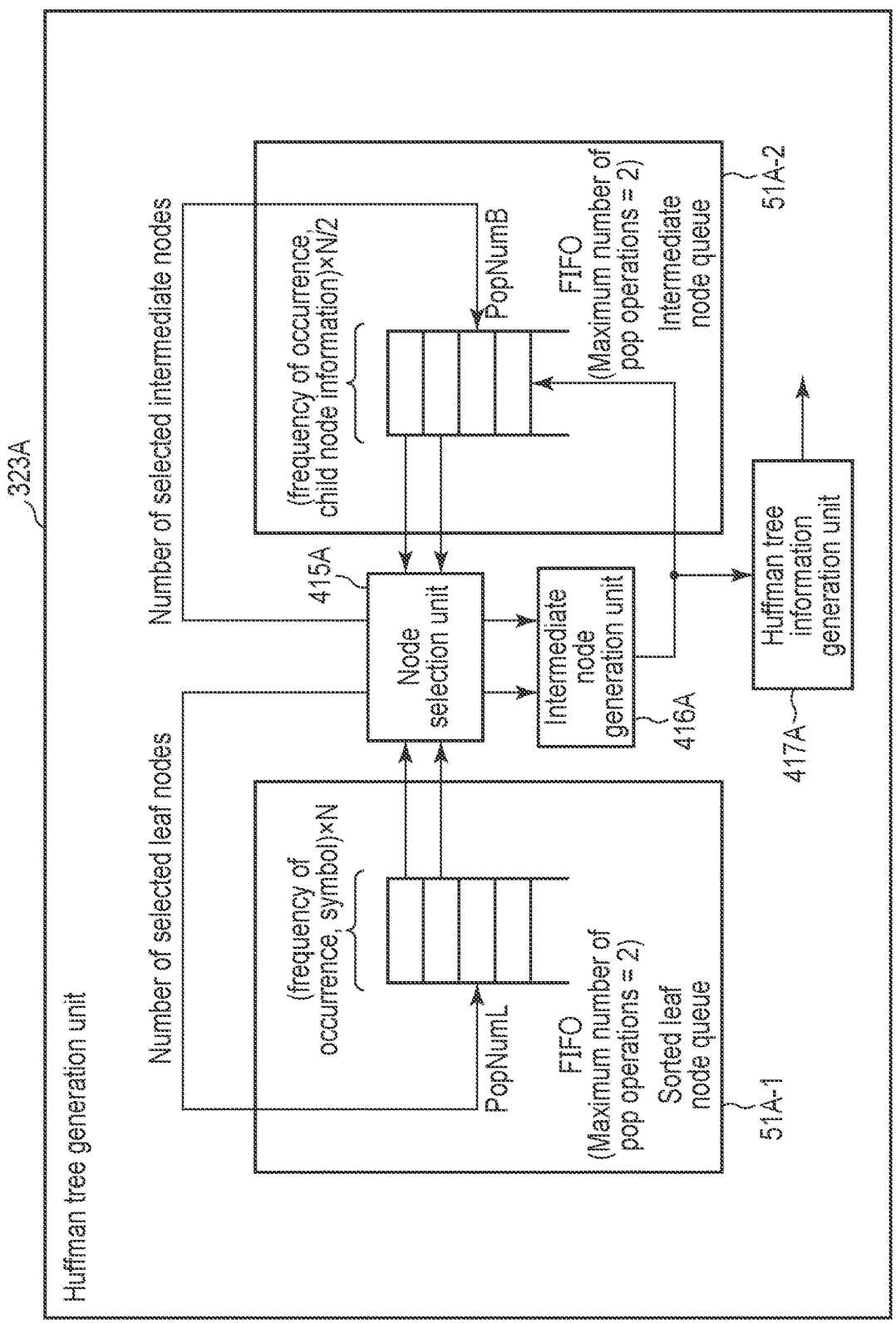
F I G. 8

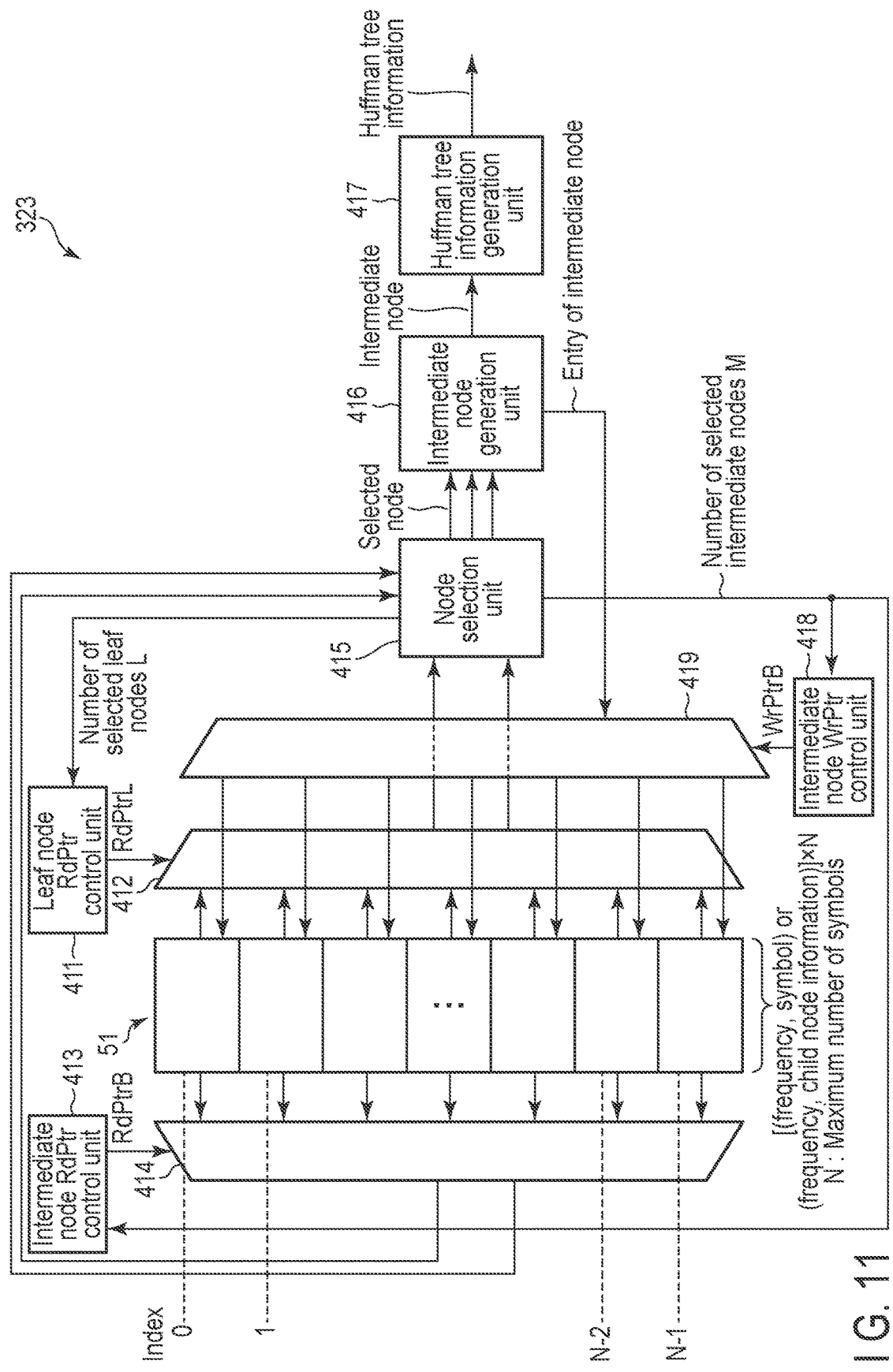
F I G. 11

| RdPtr/WrPtr | Initial value | Update method |
|---|---|---|
| Leaf node RdPtr | 0 | += number L of leaf nodes among selected two nodes having smaller frequencies of occurrence (selected nodes) |
| Intermediate node RdPtr | 0 | += number M of intermediate nodes among selected two nodes having smaller frequencies of occurrence (selected nodes) |
| Intermediate node WrPtr | 0 | += 1 |

F I G. 12

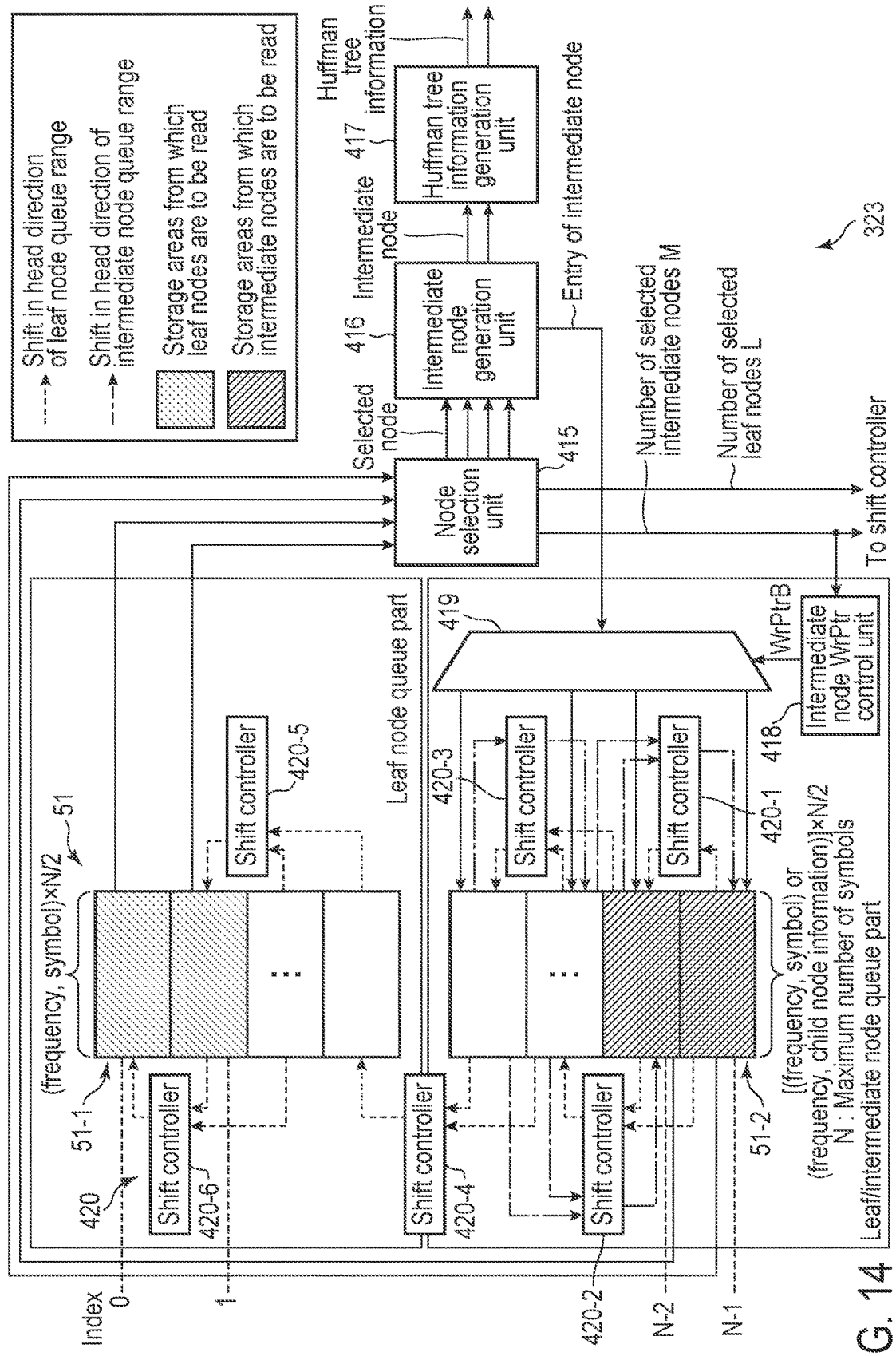
F I G. 14

| | Initial value | Update method |
|---|---|---|
| Intermediate node WrPtr | N-1 | += ((number M of intermediate nodes among selected two nodes having smaller frequencies of occurrence (selected nodes)) − 1) |

F I G. 15

Initial state

| Index | Freq. | Symbol | Node type |
|---|---|---|---|
| 0 | 2 | a | Leaf |
| 1 | 2 | e | Leaf |
| 2 | 2 | b | Leaf |
| 3 | 3 | f | Leaf |
| 4 | 5 | c | Leaf |
| 5 | 6 | d | Leaf |

WrPtrB → (index 5)

Leaf node queue range — 51L

After first loop operation

| Index | Freq. | Symbol | Node type |
|---|---|---|---|
| 0 | 2 | b | Leaf |
| 1 | 3 | f | Leaf |
| 2 | 5 | c | Leaf |
| 3 | 6 | d | Leaf |
| 4 | 4 | X | Inter. |
| 5 |   |   |   |

WrPtrB → (index 4)

Leaf node queue range — 51L
Intermediate node queue range — 51B

After second loop operation

| Index | Freq. | Symbol | Node type |
|---|---|---|---|
| 0 | 5 | c | Leaf |
| 1 | 6 | d | Leaf |
| 2 |   |   |   |
| 3 |   |   |   |
| 4 | 5 | Y | Inter. |
| 5 | 4 | X | Inter. |

WrPtrB → (index 3)

Leaf node queue range — 51L
Intermediate node queue range — 51B

After third loop operation

| Index | Freq. | Symbol | Node type |
|---|---|---|---|
| 0 | 6 | d | Leaf |
| 1 |   |   |   |
| 2 |   |   |   |
| 3 |   |   |   |
| 4 | 9 | Z | Inter. |
| 5 | 5 | Y | Inter. |

WrPtrB → (index 3)

Leaf node queue range — 51L
Intermediate node queue range — 51B

After fourth loop operation

| Index | Freq. | Symbol | Node type |
|---|---|---|---|
| 0 |   |   |   |
| 1 |   |   |   |
| 2 |   |   |   |
| 3 |   |   |   |
| 4 | 11 | W | Inter. |
| 5 | 9 | Z | Inter. |

WrPtrB → (index 3)

Intermediate node queue range — 51B

Legend:
- ⌐ ¬ Two selected nodes having smaller frequencies of occurrence
- ⌐ ¬ Added intermediate node

F I G. 16

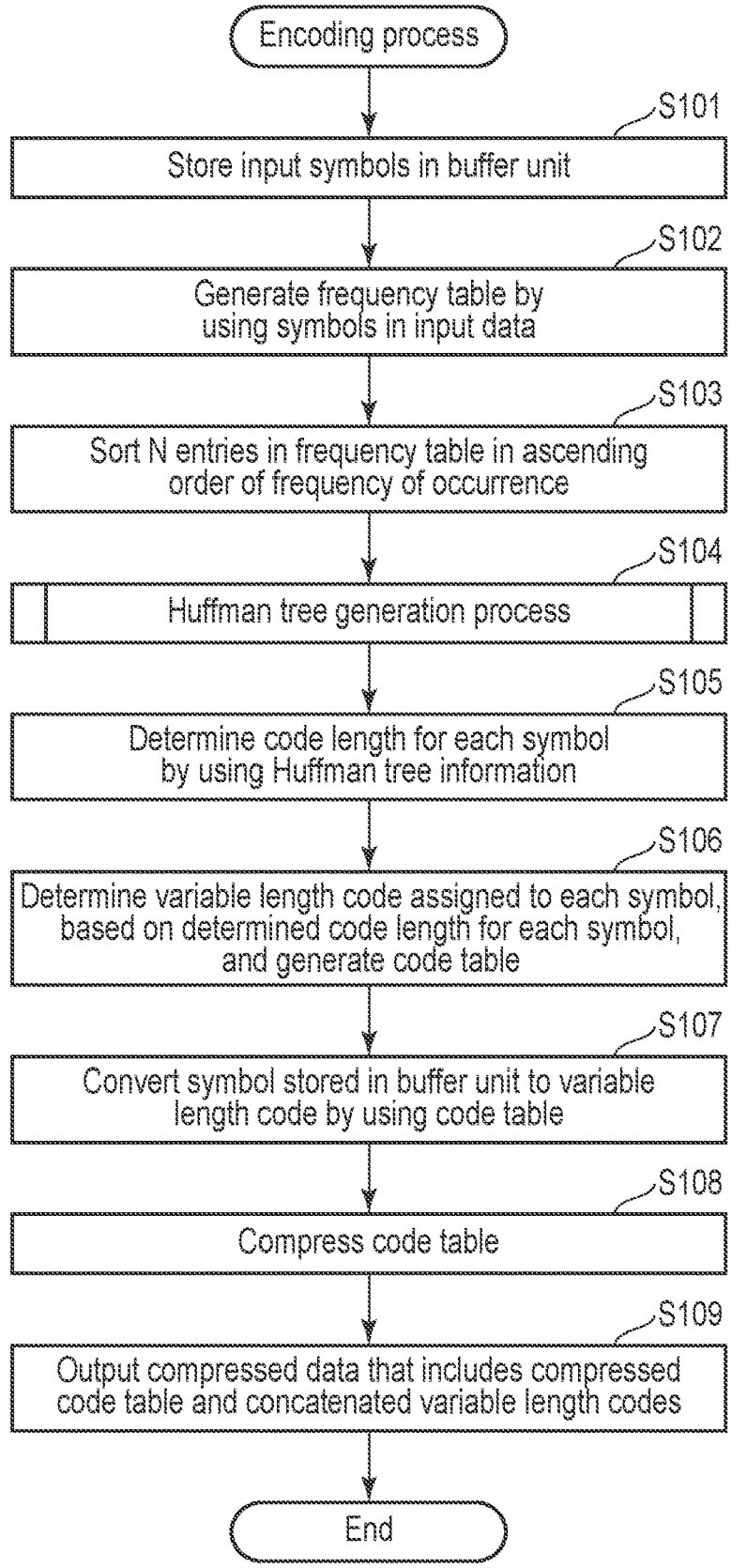
F I G. 18

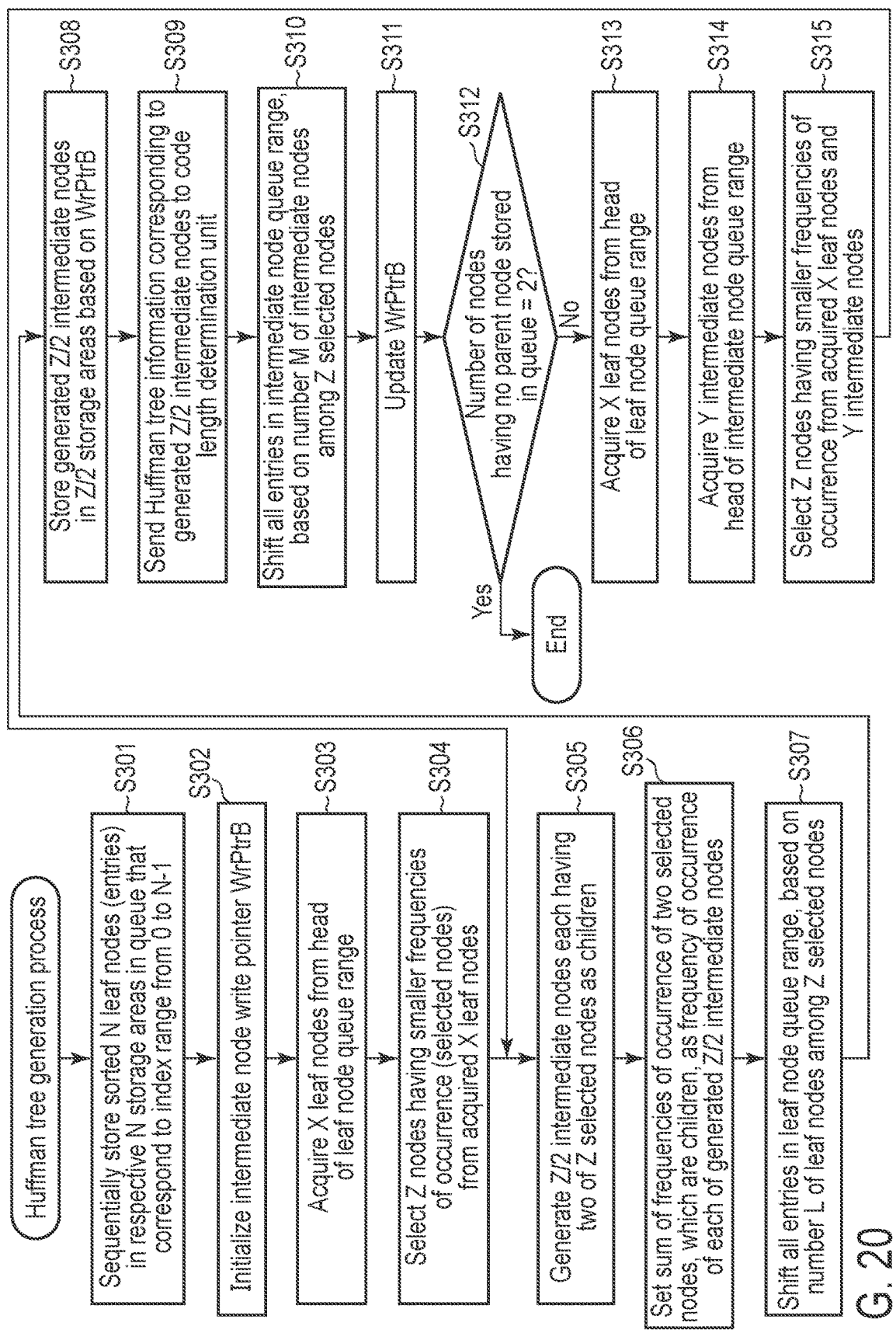
F I G. 20

CODE TABLE GENERATION DEVICE, MEMORY SYSTEM, AND CODE TABLE GENERATION METHOD

CROSS-REFERENCE TO RELATED APPLICATIONS

This application is based upon and claims the benefit of priority from Japanese Patent Application No. 2022-199535, filed Dec. 14, 2022, the entire contents of which are incorporated herein by reference.

FIELD

Embodiments described herein relate generally to a code table generation device, a memory system, and a code table generation method.

BACKGROUND

Dynamic Huffman coding is a variable length coding method for dynamically generating a code table based on a frequency of occurrence of each of symbols to be encoded. The code table indicates correspondence between a symbol and a code word that is assigned to the symbol. In the dynamic Huffman coding, a short code word is assigned to a symbol having a high frequency of occurrence, and a long code word is assigned to a symbol having a low frequency of occurrence.

More specifically, in the dynamic Huffman coding, for example, a Huffman tree including, as leaf nodes, one or more types of symbols that have occurred is constructed. Then, a code length for each symbol is determined by using the constructed Huffman tree.

A device that generates the code table includes, for example, a queue that stores information of leaf nodes in order to construct the Huffman tree. In a process of constructing the Huffman tree, an intermediate node having two leaf nodes as child nodes is generated. Therefore, the device that generates the code table may further include a queue that stores information of the intermediate node.

In a case where the device that generates the code table includes not only the queue storing information of leaf nodes but also the queue storing information of intermediate nodes, a circuit scale (for example, the number of gates) of the device increases.

BRIEF DESCRIPTION OF THE DRAWINGS

FIG. 1 is a block diagram illustrating an example of a configuration of an information processing system that includes a code table generation device according to a first embodiment.

FIG. 2 is a block diagram illustrating an example of a configuration of a compression device that includes the code table generation device according to the first embodiment.

FIG. 3 is a diagram illustrating an example of a frequency table that is used in the code table generation device according to the first embodiment.

FIG. 4 is a diagram illustrating an example of the frequency table sorted in ascending order of frequency of occurrence that is used in the code table generation device according to the first embodiment.

FIG. 5 is a diagram illustrating an example of code lengths that are determined in the code table generation device according to the first embodiment.

FIG. 6 is a diagram illustrating an example of a pseudo-program for assigning a code bit string to a symbol that is executed in the code table generation device according to the first embodiment.

FIG. 8 is a block diagram illustrating an example of a configuration of a code table generation device according to a comparative example.

FIG. 11 is a block diagram illustrating an example of a configuration of a Huffman tree generation unit in the code table generation device according to the first embodiment.

FIG. 12 is a diagram illustrating an example of initial values and update methods for pointers that are used in the Huffman tree generation unit of FIG. 11.

FIG. 14 is a block diagram illustrating an example of a configuration of a Huffman tree generation unit in a code table generation device according to a second embodiment.

FIG. 15 is a diagram illustrating an example of an initial value and an update method for a pointer used in the Huffman tree generation unit in FIG. 14.

FIG. 16 is a diagram illustrating an example of transition of nodes stored in a queue and pointers, in a Huffman tree construction process by the Huffman tree generation unit of FIG. 14.

FIG. 18 is a flowchart illustrating an example of the procedure of an encoding process executed in the code table generation device according to the first embodiment.

FIG. 20 is a flowchart illustrating another example of the procedure of the Huffman tree generation process executed in the code table generation device according to the third embodiment.

DETAILED DESCRIPTION

Figure 7:
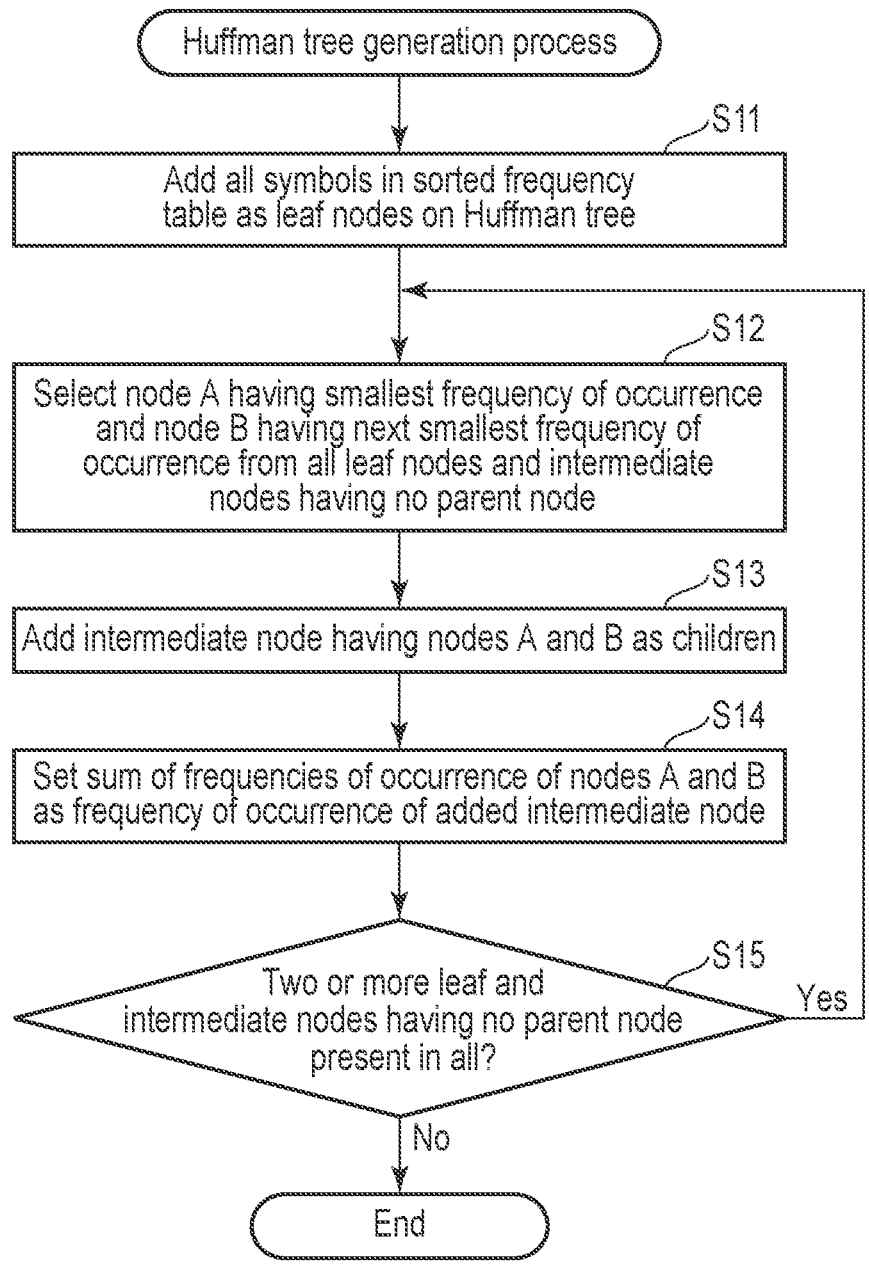
FIG. 7 is a flowchart illustrating an example of the schematic procedure of a Huffman tree generation process executed in the code table generation device according to the first embodiment.

In general, according to one embodiment, a code table generation device includes a frequency table generation unit, a frequency sorting unit, a Huffman tree generation unit, a code length determination unit, and a code determination unit. The frequency table generation unit generates a frequency table based on a frequency of occurrence for each symbol of input symbols. The frequency table includes entries each including a symbol and a frequency of occurrence. The frequency sorting unit sorts the entries in the frequency table by frequency of occurrence. The Huffman tree generation unit generates a Huffman tree having leaf nodes by using a queue that includes storage areas in which the sorted entries are respectively stored as the leaf nodes in an initial state, in response to the entries having been sorted. The code length determination unit determines a code length for each symbol of the symbols, based on the Huffman tree. The code determination unit determines a code for each symbol of the symbols, based on the code length for each symbol. Each of the storage areas is capable of being allocated as either a leaf node queue range that stores a leaf node or an intermediate node queue range that stores an intermediate node. One or more storage areas allocated as the leaf node queue range are capable of storing one or more leaf nodes, respectively, in order from a head of the leaf node queue range. The one or more leaf nodes are arranged in ascending order of frequency of occurrence. One or more storage areas allocated as the intermediate node queue range are capable of storing one or more intermediate nodes, respectively, in order from a head of the intermediate node queue range. The one or more intermediate nodes are arranged in ascending order of frequency of occurrence. The Huffman tree generation unit selects Z nodes having smaller frequencies of occurrence from X leaf nodes and Y intermediate nodes. The X leaf nodes are stored in X storage areas from the head of the leaf node queue range. The Y intermediate nodes are stored in Y storage areas from the head of the intermediate node queue range. The Huffman tree generation unit generates Z/2 intermediate nodes each having two nodes of the Z nodes as children. The Huffman tree generation unit allocates, as the intermediate node queue range, at least one storage area in the leaf node queue range that has become capable of being reallocated in response to at least one of the X leaf nodes having been selected as the Z nodes. The Huffman tree generation unit stores the Z/2 intermediate nodes in the intermediate node queue range in a first-in first-out manner. Each of the stored Z/2 intermediate nodes indicates child node information related to the two nodes that are had as children and a sum of frequencies of occurrence of the respective two nodes that are had as children. X is an integer of one or more. Y is an integer of one or more. A sum of X and Y is larger than Z. Z is an integer of two or more and a multiple of two.

Various embodiments will be described hereinafter with reference to the accompanying drawings.

First Embodiment

FIG. 1 illustrates an example of a configuration of an information processing system that includes a code table generation device according to a first embodiment. The information processing system 1 includes a host device 2 (hereinafter, referred to as a host 2) and a memory system 3.

The memory system 3 is a semiconductor storage device configured to write data into a nonvolatile memory such as a NAND flash memory 5 and read data from the nonvolatile memory. The memory system 3 is realized, for example, as a solid state drive (SSD) that includes the NAND flash memory 5. Hereinafter, although a case where the memory system 3 is realized as the SSD will be exemplified, the memory system 3 may be realized as a hard disk drive (HDD).

The host 2 may be a storage server that stores a large amount of various data in the memory system 3, or may be a personal computer.

The memory system 3 may be used as a storage of the host 2. The memory system 3 may be built in the host 2 or may be connected to the host 2 via a cable or a network.

An interface for connecting the host 2 and the memory system 3 conforms to SCSI, Serial Attached SCSI (SAS), AT Attachment (ATA), Serial ATA (SATA), PCI Express™ (PCIe™), Ethernet™, Fibre channel, NVM Express™ (NVMe™), and the like.

The memory system 3 includes a controller 4 and the NAND flash memory 5. The controller 4 may be realized by a circuit such as a system-on-a-chip (SoC).

The memory system 3 may include a random access memory (RAM) which is a volatile memory, such as a dynamic random access memory (DRAM) 6. Alternatively, a RAM such as a static random access memory (SRAM) may be built in the controller 4. Note that the DRAM 6 may be built in the controller 4.

The DRAM 6 is a volatile memory. The RAM such as the DRAM 6 includes, for example, a storage area of firmware (FW) and a cache area of a logical-to-physical address conversion table.

The NAND flash memory 5 includes multiple blocks. Each of the blocks includes multiple pages. The blocks each function as a minimum erase unit. A block may be referred to as an erase block or a physical block. Each of the pages include multiple memory cells connected to a single word line. The pages each function as a unit of a data write operation and a data read operation. Note that a word line may be used as a unit of a data write operation and a data read operation.

The tolerable maximum number of program/erase cycles (maximum number of P/E cycles) for each of the blocks is limited. One P/E cycle of a block includes an erase operation to erase data stored in all memory cells in the block and a write operation to write data in each page of the block.

The controller 4 includes, for example, a host interface (host I/F) 11, a CPU 12, a NAND interface (NAND I/F) 13, a DRAM interface (DRAM I/F) 14, and a compression device 15. The host I/F 11, the CPU 12, the NAND I/F 13, the DRAM I/F 14, and the compression device 15 may be connected to each other via a bus 10.

The controller 4 is electrically connected to the NAND flash memory 5 via the NAND I/F 13 that conforms to an interface standard such as a Toggle DDR or an Open NAND Flash Interface (ONFI). The NAND I/F 13 functions as a NAND control circuit configured to control the NAND flash memory 5.

The controller 4 functions as a memory controller configured to control the NAND flash memory 5.

The controller 4 may function as a flash translation layer (FTL) configured to execute data management and block management of the NAND flash memory 5. The data management executed by the FTL includes (1) management of mapping information indicative of relationship between each logical address and each physical address of the NAND flash memory 5, and (2) process to hide a difference between data read operations/data write operations in units of page and data erase operations in units of block. The block management includes management of defective blocks, wear leveling, and garbage collection.

The logical address is an address used by the host 2 for addressing a storage area of the memory system 3. The management of mapping between each logical address and each physical address is executed by using the logical-to-physical address conversion table. The controller 4 uses the logical-to-physical address conversion table to manage the mapping between each logical address and each physical address with a certain management size. A physical address corresponding to a logical address indicates a physical memory location in the NAND flash memory 5 to which data of the logical address is written. The logical-to-physical address conversion table may be loaded from the NAND flash memory 5 to the DRAM 6 when the memory system 3 is powered on.

Data write into one page is executable only once in a single P/E cycle. Thus, the controller 4 writes update data corresponding to a logical address not to an original physical memory location in which previous data corresponding to the logical address is stored but to a different physical memory location. Then, the controller 4 updates the logical-to-physical address conversion table to associate the logical address with the different physical memory location and to invalidate the previous data.

The host I/F 11 is a hardware interface that performs communication between the memory system 3 and the host 2 that is an external device of the memory system 3. The host I/F 11 includes a circuit that receives various commands, for example, input/output (I/O) commands and various control commands from the host 2. The I/O commands may include a write command and a read command. The control commands may include an unmap command (trim command) and a format command. The host I/F 11 includes a circuit that transmits to the host 2 a response or data corresponding to a command.

The DRAM I/F 14 functions as a DRAM control circuit configured to control access to the DRAM 6.

The CPU 12 is a processor configured to control the host I/F 11, the NAND I/F 13, the DRAM I/F 14, and the compression device 15. The CPU 12 performs various processes by executing the FW loaded in the DRAM 6. That is, the FW is control programs for controlling the operation of the CPU 12. The CPU 12 may perform, in addition to the above described processes of FTL, command processes to process various commands from the host 2. Note that part of or the entire FTL processes and the command processes may be executed by a dedicated hardware in the controller 4.

The compression device 15 is a Huffman coding unit that encodes data to be written into the NAND flash memory 5 to compress the data. For example, the CPU 12 inputs write data received in accordance with reception of a write command from the host 2, to the compression device 15 as plain text data. The compression device 15 encodes the plain text data input from the CPU 12. In order to compress data, the compression device 15 includes, for example, a configuration for realizing dynamic Huffman coding.

The dynamic Huffman coding is a variable length coding for dynamically generating a code table (coding table) by using a frequency of occurrence of each symbol to be encoded. The code table includes information indicative of symbols and variable length codes (code words) that are associated with the symbols, respectively. In the dynamic Huffman coding, a short code word is assigned to a symbol having a high frequency of occurrence, and a long code word is assigned to a symbol having a low frequency of occurrence. The compression device 15 converts an input symbol into a code word in accordance with such assignment. Accordingly, a code word obtained by the conversion is a variable length code. Note that the symbol is, for example, data of a fixed length.

The symbol to be encoded is one of N types of symbols. That is, N indicates an upper limit number of types of symbols appearing as encoding targets. For example, in the DEFLATE format (RFC 1951), N is 286.

The compression device 15 includes a code table generation device 32. The code table generation device 32 is a device that generates a code table for converting a symbol into a variable length code. The code table generation device 32 may be a device included in the compression device 15 or may be a part of a circuit that realizes the compression device 15. Hereinafter, the code table generation device 32 will be also referred to as a code table generation unit 32.

FIG. 2 illustrates an example of a configuration of the compression device 15. The compression device 15 includes, for example, a buffer unit 31, the code table generation unit 32, a variable length encoding unit 33, a code table compression unit 34, and a packing unit 35.

The buffer unit 31 stores (buffers) symbols input to the compression device 15. The buffer unit 31 delays the stored symbols until, for example, a specific timing, and sends the symbols to the variable length encoding unit 33.

The code table generation unit 32 generates a code table by using the symbols input to the compression device 15. The code table includes information indicative of symbols and variable length codes (that is, code bit strings) that are associated with the symbols, respectively. The code table generation unit 32 starts the generation of the code table in response to a predetermined number of symbols being stored in the buffer unit 31. The predetermined number is, for example, 1024.

More specifically, the code table generation unit 32 generates the code table based on frequencies of occurrence of symbols that are included in input data of a specific unit. The specific unit may be a unit of specific data amount or may be a specific group such as a file. In a case where the unit is a specific group, the code table generation unit 32 detects data indicating a terminal of the input data to recognize the input data of the specific unit.

The code table generation unit 32 sends the generated code table to the variable length encoding unit 33. The code table generation unit 32 sends, to the code table compression unit 34, the lengths of the variable length codes (that is, code lengths) that are assigned to the symbols, respectively, indicated in the code table.

The code table compression unit 34 compresses the code table. Specifically, the code table compression unit 34 performs a compression process on the code lengths received from the code table generation unit 32. The compression process performed on the code lengths is, for example, a process of arranging the code lengths in a specific symbol order, performing run-length encoding on the arranged code lengths, and further performing Huffman coding on the result, as indicated in the DEFLATE format (RFC 1951). The specific symbol order is, for example, an order conforming to the corresponding symbols in an alphabetical order. That is, the code lengths arranged in the specific symbol order is, for example, code lengths arranged so as to correspond to the symbols, respectively, that are arranged in the alphabetical order. The code table compression unit 34 sends the data obtained by the compression process (i.e., compressed code table) to the packing unit 35.

The variable length encoding unit 33 converts a symbol sent from the buffer unit 31 into a variable length code (code bit string) by using the code table sent from the code table generation unit 32. The variable length encoding unit 33 sends the variable length code obtained by the conversion to the packing unit 35.

The packing unit 35 sequentially concatenates one or more variable length codes output from the variable length encoding unit 33, and outputs the concatenated variable length codes as compressed data (compressed stream) for each specific data size. The specific data size is, for example, 64 bits. Further, the packing unit 35 inserts the compressed code table output from the code table compression unit 34 as a header of the compressed data. The compressed code table is used to restore the code table (decoding table) when the compressed data is decoded in a decompressor.

With the above configuration, the compression device 15 can perform the dynamic Huffman coding on the input symbols to convert the input symbols into the variable length codes. For example, in a case where the input symbols are data requested to be written to the NAND flash memory 5 by the host 2, the CPU 12 writes the compressed data that includes the one or more variable length codes and the compressed code table, into the NAND flash memory 5 via the NAND I/F 13.

The controller 4 may further include an ECC encoder and an ECC decoder. In this case, the ECC encoder generates a parity for error correction (ECC parity) for the compressed data output from the packing unit 35, and generates a code word having the generated ECC parity and the compressed data. The CPU 12 is configured to write the code word into the NAND flash memory 5 via the NAND I/F 13. That is, the CPU 12 is configured to write data based on the compressed data output from the compression device 15 into the NAND flash memory 5 via the NAND I/F 13. Further, for example, in a case where a read command is received from the host 2 via the host I/F 11, the CPU 12 reads data based on the read command from the NAND flash memory 5 via the NAND I/F 13. The ECC decoder executes error correction processing on the read data. The read data on which the error correction processing has been executed is input to the decompressor by the CPU 12 as compressed data, and the decompressor decompresses the input compressed data. The CPU 12 transmits the decompressed data to the host 2 as a response to the read command from the host 2. That is, in response to the read command from the host 2, the CPU 12 is configured to decompress data based on data read from the NAND flash memory 5 and transmit the decompressed data to the host 2.

A part or all of the compression device 15 may be realized as hardware such as a circuit, or may be realized as programs (i.e., software) executed by at least one processor.

Next, a specific configuration of the code table generation unit 32 will be described. The code table generation unit 32 includes, for example, a frequency counting unit 321, a frequency sorting unit 322, a Huffman tree generation unit 323, a code length determination unit 324, and a canonical Huffman unit 325.

The frequency counting unit 321 generates a frequency table 37 based on a frequency of occurrence for each symbol of the input symbols. For example, the frequency counting unit 321 counts the number of occurrences for each symbol of the input symbols, thereby generating the frequency table 37. For example, the frequency counting unit 321 generates the frequency table 37 every time 1024 symbols are input. The frequency table 37 is a table indicative of symbols and frequencies of occurrence (for example, the numbers of occurrences) that are associated with the symbols, respectively. The frequency counting unit 321 sends the frequency table 37 to the frequency sorting unit 322.

The frequency sorting unit 322 sorts entries in the frequency table 37 by using the frequencies of occurrence as a key. The sort order is ascending order of frequency of occurrence or descending order of frequency of occurrence. The frequency table obtained by the sorting will be referred to as a sorted frequency table 38. The frequency sorting unit 322 sends the sorted frequency table 38 to the Huffman tree generation unit 323.

FIG. 3 illustrates an example of the frequency table 37 generated by the frequency counting unit 321. The frequency table 37 includes N entries that correspond to N types of symbols, respectively. In the example illustrated in FIG. 3, N is 286. Each of the entries includes a symbol field and a frequency of occurrence field.

The symbol field indicates a corresponding symbol.

The frequency of occurrence field indicates a frequency of occurrence of the corresponding symbol. More specifically, the frequency of occurrence field indicates, for example, a frequency (for example, the number of times) at which the corresponding symbol appears in one or more symbols included in the input data that is a processing target.

Hereinafter, the value indicated in the symbol field is also simply referred to as a symbol. The same applies to a value indicated in the other field of the frequency table 37 and a value indicated in each of fields of the other tables.

In the example illustrated in FIG. 3, a frequency of occurrence of a symbol "a" is three. A frequency of occurrence of a symbol "b" is five. A frequency of occurrence of a symbol "c" is one. A frequency of occurrence of a symbol "d" is one. A frequency of occurrence of a symbol "A" is eight. A frequency of occurrence of a symbol "B" is 11. A frequency of occurrence of a symbol "C" is 20.

FIG. 4 illustrates an example of the sorted frequency table 38 acquired by the frequency sorting unit 322. The sorted frequency table 38 is a table in which the N entries in the frequency table 37 are rearranged in ascending order of frequency of occurrence.

In the example illustrated in FIG. 4, the first entry indicates the symbol "c" having the smallest frequency of occurrence, which is one. The second entry indicates another symbol "d" having the smallest frequency of occurrence, which is one. Furthermore, for example, the third entry indicates the symbol "a" having the next smallest frequency of occurrence, which is three.

As described above, in the sorted frequency table 38, the entries are arranged in ascending order of frequency of occurrence.

The description returns to FIG. 2.

The Huffman tree generation unit 323 generates (constructs) a Huffman tree by using the sorted frequency table 38. The Huffman tree generation unit 323 sends the generated Huffman tree to the code length determination unit 324. A specific configuration and processing of generating the Huffman tree will be described later with reference to FIGS. 7 to 20.

The code length determination unit 324 determines code lengths of symbols by using the Huffman tree received from the Huffman tree generation unit 323. A depth of a leaf node starting from a root node of the Huffman tree (that is, the number of edges traced from the root node to the leaf node) corresponds to a code length of a corresponding symbol. Therefore, the code length determination unit 324 can determine the code length for each symbol by using the Huffman tree. The code length determination unit 324 sends the determined code lengths of symbols to the canonical Huffman unit 325.

FIG. 5 illustrates an example of the code length for each symbol determined by the code length determination unit 324 by using the Huffman tree.

Specifically, the code length of the symbol "C" is 1 bit. The code length of the symbol "B" is 2 bits. The code length of the symbol "A" is 3 bits. The code length of the symbol "b" is 5 bits. The code length of the symbol "a" is 6 bits. The code length of each of the symbols "c" and "d" is 8 bits.

As described above, a symbol having a higher frequency of occurrence has a shorter code length. For example, since the symbol "C" has the highest frequency of occurrence, which is 20, in the sorted frequency table 38 illustrated in FIG. 4, the code length of the symbol "C" is 1 bit, which is the shortest. In addition, a symbol having a smaller frequency of occurrence has a longer code length. For example, since the symbol "c" has the lowest frequency of occurrence in the sorted frequency table 38 illustrated in FIG. 4, the code length of the symbol "c" is 8 bits, which is the longest.

The description returns to FIG. 2.

The canonical Huffman unit 325 generates a code table by using the code lengths of the respective symbols received from the code length determination unit 324. The canonical Huffman unit 325 generates the code table according to, for example, a canonical Huffman coding. The canonical Huffman coding is capable of determining a code bit string (variable length code) to be assigned to each of symbols by using only code lengths of the symbols. In the canonical Huffman coding, a code bit string is assigned to each symbol according to the following rules (A1) and (A2).

(A1) A code bit string to be assigned to a symbol having a short code length precedes, in dictionary order, a code bit string to be assigned to a symbol having a long code length.

(A2) In any two symbols having the same code length, a code bit string assigned to one of the two symbols preceding in symbol order precedes, in the dictionary order, a code bit string assigned to the other of the two symbols succeeding in the symbol order.

For example, in order to determine the dictionary order of a code bit string, the dictionary order of bit values "0" and "1" is defined as the order of "0" and "1". In this case, each bit value included in a code bit string and each bit value included in another code bit string are compared in order from a higher bit to determine the order (bit order) of the corresponding bit values, thereby determining the dictionary order of the code bit strings.

More specifically, for example, "1'b0", "2'b10", "3'b110", and "3'b111" are four code bit strings arranged in the dictionary order. Note that a data string including a bit value of 0 or 1 subsequent to "x'b" indicates a bit data string of x bits. Therefore, in these four code bit strings, the 1-bit code bit string "1'b0" precedes the 2-bit code bit string "2'b10" in the bit order of the most significant bits. The 2-bit code bit string "2'b10" precedes the 3-bit code bit string "3'b110" in the bit order of the next most significant bits. The 3-bit code bit string "3'b110" precedes the 3-bit code bit string "3'b111" in the bit order of the least significant bits.

FIG. 6 illustrates an example of a pseudo-program for the canonical Huffman unit 325 to assign a code bit string to a symbol. In the pseudo-program, a variable "code" is used to calculate a code bit string to be assigned to a symbol.

First, the canonical Huffman unit 325 sets the variable "code" to 0 (=1'b0). Note that in a case where code bit strings are to be assigned to symbols, respectively, the number of bits of the variable "code" depends upon a minimum code length of code lengths that are associated with the symbols, respectively.

Next, in one while loop, the canonical Huffman unit 325 determines a code bit string to be assigned to one symbol in ascending code length order and in specific symbol order in the case of the same code length.

For example, in the first while loop, the canonical Huffman unit 325 selects, as a target to which a code bit string is to be assigned, a symbol that has the shortest code length and precedes, in specific symbol order, another symbol having the same code length, if any. Then, the canonical Huffman unit 325 assigns the variable "code" (=1'b0) to a code bit string of the selected symbol. As described above, the number of bits of the variable "code" assigned first depends on the minimum code length. In this example, it is assumed that the minimum code length is one. Then, the canonical Huffman unit 325 performs a shift operation of shifting a value that is obtained by adding one to the variable "code", to the left by the number of bits obtained by subtracting the code length of the current symbol from the code length of the next symbol, and sets the value obtained by the shift operation as the variable "code". For example, in a case where the number of bits obtained by subtracting the code length of the current symbol from the code length of the next symbol is one, a value 2'b10 obtained by shifting 1'b1 that is a value obtained by adding one to the variable "code" (=1'b0), to the left by 1 bit is set as the variable "code".

Furthermore, for example, in the second while loop, the canonical Huffman unit 325 selects, as a target to which a code bit string is to be assigned, a symbol that has the second shortest code length, or a symbol that has the shortest code length and is the second in the specific symbol order when there is another symbol having the same code length. The canonical Huffman unit 325 assigns the variable "code" (=2'b10) to a code bit string of the selected symbol. Then, the canonical Huffman unit 325 performs a shift operation of shifting a value that is obtained by adding one to the variable "code", to the left by the number of bits obtained by subtracting the code length of the current symbol from the code length of the next symbol, and sets the value obtained by the shift operation as the variable "code". For example, in a case where the number of bits obtained by subtracting the code length of the current symbol from the code length of the next symbol is one, a value 3'b110 obtained by shifting 2'b11 that is a value obtained by adding one to the variable "code" (=2'b10), to the left by 1 bit is set as the variable "code".

By performing such loop processing, the canonical Huffman unit 325 can assign the code bit string to each of the symbols by using the relationship in order between the symbols and the code lengths corresponding to the respective symbols. That is, the canonical Huffman unit 325 can uniquely determine the code bit string to be assigned to each of the symbols by determining the relationship in order between the symbols and the code lengths of the respective symbols.

The code table compression unit 34 performs compression processing on the code lengths that correspond to the symbols, respectively. For example, the code table compression unit 34 sorts the code lengths in specific symbol order, performs run-length encoding on the sorted code lengths, and further performs Huffman coding on the result of the run-length encoding. Accordingly, the compressed code table is acquired.

The packing unit 35 sequentially concatenates one or more variable length codes output from variable length encoding unit 33, and outputs the concatenated one or more variable length codes as compressed data for each specific data size. Further, the packing unit 35 inserts the compressed code table as a header of the compressed data. In the canonical Huffman coding, a code bit string to be assigned to each of symbols can be uniquely determined by determining the relationship in order between the symbols and the code lengths of the respective symbols. Therefore, the code table (decoding table) to be used for decoding in the decompressor can be restored from the compressed code table. By encoding the code lengths in the code table compression unit 34, a code amount overhead of the compressed data can be greatly reduced as compared with a case of encoding the code bit strings themselves.

Here, generation of a Huffman tree will be specifically described.

FIG. 7 is a flowchart illustrating an example of the schematic procedure of a Huffman tree generation process executed by the Huffman tree generation unit 323.

First, the Huffman tree generation unit 323 adds all symbols in the sorted frequency table 38 as leaf nodes on a Huffman tree (step S11). That is, the Huffman tree generation unit 323 generates a Huffman tree including leaf nodes corresponding to the number of symbols in the sorted frequency table 38.

Next, the Huffman tree generation unit 323 selects a node A having the smallest frequency of occurrence and a node B having the next smallest frequency of occurrence from all leaf nodes and intermediate nodes having no parent node in the Huffman tree (step S12). The Huffman tree generation unit 323 adds an intermediate node having the selected nodes A and B as children to the Huffman tree (step S13). Then, the Huffman tree generation unit 323 sets the sum of the frequencies of occurrence of the nodes A and B as a frequency of occurrence of the added intermediate node (step S14).

The Huffman tree generation unit 323 determines whether two or more leaf and intermediate nodes having no parent node are present in all in the Huffman tree (step S15). When two or more leaf and intermediate nodes having no parent node are present in all in the Huffman tree (Yes in step S15), the process by the Huffman tree generation unit 323 proceeds to step S12. That is, the Huffman tree generation unit 323 further performs a procedure for adding an intermediate node that has leaf and intermediate nodes having no parent node as children.

When the total number of leaf and intermediate nodes having no parent node in the Huffman tree is less than two (No in step S15), the Huffman tree generation unit 323 ends the Huffman tree generation process.

Through the above-described Huffman tree generation process, the Huffman tree generation unit 323 can generate a Huffman tree. The generated Huffman tree includes leaf nodes respectively corresponding to symbols. The Huffman tree generation unit 323 constructs the Huffman tree bottom-up from a leaf node corresponding to a symbol having a small frequency of occurrence.

In the procedure of step S12 of the Huffman tree generation process, a node A having the smallest frequency of occurrence and a node B having the next smallest frequency of occurrence are selected from all leaf and intermediate nodes having no parent node. Hereinafter, a method for efficiently performing the procedure of step S12 in the generation of the Huffman tree will be described.

First, generation of a Huffman tree in a Huffman tree generation unit 323A included in a code table generation device according to a comparative example will be described with reference to FIGS. 8 to 10. The code table generation device according to the comparative example has a similar configuration to the code table generation device 32 according to the first embodiment except for the Huffman tree generation unit 323A.

FIG. 8 is a block diagram illustrating an example of a configuration of the Huffman tree generation unit 323A. The Huffman tree generation unit 323A includes a leaf node queue 51A-1, an intermediate node queue 51A-2, a node selection unit 415A, an intermediate node generation unit 416A, and a Huffman tree information generation unit 417A.

The leaf node queue 51A-1 is a queue capable of storing leaf node entries (i.e., entries of leaf nodes). The leaf node queue 51A-1 includes N storage areas. Each of the N storage areas is capable of storing one leaf node entry. A leaf node entry includes, for example, data that indicates a symbol and a frequency of occurrence that are assigned to a leaf node. Addition (push) of an entry to the leaf node queue 51A-1 and deletion (pop) of an entry from the leaf node queue 51A-1 are performed in a first-in first-out (FIFO) manner.

In an initial state, a sorted frequency table is stored in the leaf node queue 51A-1 in the FIFO manner. Specifically, entries in the sorted frequency table are stored in storage areas of the leaf node queue 51A-1 in order from the head. The configuration of the sorted frequency table is similar to that of the sorted frequency table 38 described above with reference to FIG. 4. Therefore, the entries in the sorted frequency table are entries sorted in ascending order of frequency of occurrence. Hereinafter, a leaf node entry stored in a storage area of a queue will be also simply referred to as a leaf node.

The intermediate node queue 51A-2 is a queue capable of storing intermediate node entries (i.e., entries of intermediate nodes). The intermediate node queue 51A-2 includes N/2 storage areas. Each of the N/2 storage areas is capable of storing one intermediate node entry. An intermediate node entry includes, for example, data that indicates a frequency of occurrence and child node information that are assigned to an intermediate node. The child node information is information related to two nodes that are had as children by the corresponding intermediate node. The two nodes had as children by the intermediate node are any one of a combination of two leaf nodes, a combination of two intermediate nodes, and a combination of one leaf node and one intermediate node. The child node information includes, for example, at least one of information indicative of a symbol assigned to a child leaf node and identification information of a child intermediate node. The identification information of an intermediate node is information by which the corresponding intermediate node is uniquely identifiable.

In the initial state, no intermediate node entry is stored in the intermediate node queue 51A-2. Hereinafter, an intermediate node entry stored in a storage area in a queue will be also simply referred to as an intermediate node.

In order to generate a new intermediate node, the node selection unit 415A selects two child nodes from leaf nodes stored in the leaf node queue 51A-1 and intermediate nodes stored in the intermediate node queue 51A-2.

Specifically, the node selection unit 415A reads two leaf nodes from the first two storage areas of the leaf node queue 51A-1. The read two leaf nodes are two leaf nodes having smaller frequencies of occurrence among the leaf nodes stored in the leaf node queue 51A-1. When only one leaf node is stored in the leaf node queue 51A-1, the node selection unit 415A reads the leaf node from the first storage area of the leaf node queue 51A-1. When no leaf node is stored in the leaf node queue 51A-1, the node selection unit 415A does not read any leaf node from the leaf node queue 51A-1.

The node selection unit 415A reads two intermediate nodes from the first two storage areas of the intermediate node queue 51A-2. The two read intermediate nodes are two intermediate nodes having smaller frequencies of occurrence among the intermediate nodes stored in the intermediate node queue 51A-2. When only one intermediate node is stored in the intermediate node queue 51A-2, the node selection unit 415A reads the intermediate node from the first storage area of the intermediate node queue 51A-2. When no intermediate node is stored in the intermediate node queue 51A-2, the node selection unit 415A does not read any intermediate node from the intermediate node queue 51A-2.

Hereinafter, it is assumed that the node selection unit 415A reads two leaf nodes from the leaf node queue 51A-1 and reads two intermediate nodes from the intermediate node queue 51A-2. The two read leaf nodes and the two read intermediate nodes will be also referred to as four leaf/intermediate nodes.

The node selection unit 415A selects two nodes having smaller frequencies of occurrence from the read four leaf/intermediate nodes. That is, the node selection unit 415A selects the first node and the second node in a case where the four leaf/intermediate nodes are sorted in ascending order of frequency of occurrence. Each of the selected two nodes will be also referred to as a selected node. The node selection unit 415A sends the two selected nodes to the intermediate node generation unit 416A.

The node selection unit 415A performs a pop operation on the leaf node queue 51A-1 by the number of times PopNumL corresponding to the number of leaf nodes among the two selected nodes. The pop operation is an operation of deleting the first entry (that is, the first node) and shifting the remaining entries in a head direction. The node selection unit 415A performs the pop operation on the intermediate node queue 51A-2 by the number of times PopNumB corresponding to the number of intermediate nodes among the two selected nodes. Both PopNumL and PopNumB are two at most.

The intermediate node generation unit 416A generates an intermediate node that has the two selected nodes received from the node selection unit 415A as children. The intermediate node generation unit 416A sets the sum of the frequencies of occurrence of the two selected nodes as a frequency of occurrence of the generated intermediate node. Then, the intermediate node generation unit 416A sends the generated intermediate node to the intermediate node queue 51A-2 and the Huffman tree information generation unit 417A.

In the intermediate node queue 51A-2, an entry of the intermediate node received from the intermediate node generation unit 416A is stored (pushed) in the FIFO manner.

The Huffman tree information generation unit 417A generates Huffman tree information corresponding to the received intermediate node. The Huffman tree information includes, for example, identification information and child node information of the intermediate node.

One cycle of operation by the node selection unit 415A, the intermediate node generation unit 416A, and the Huffman tree information generation unit 417A described above is one loop operation in the Huffman tree generation unit 323A. This loop operation is repeatedly performed until neither the leaf node queue 51A-1 nor the intermediate node queue 51A-2 stores a node having no parent node. Each time the loop operation is repeated, the Huffman tree information generation unit 417A generates an item of Huffman tree information corresponding to a newly generated intermediate node. The generated item of Huffman tree information includes information that indicates at least one of a leaf node and an intermediate node that are included in a Huffman tree. Therefore, the Huffman tree generation unit 323A of the comparative example can generate the Huffman tree corresponding to the sorted frequency table by using all generated items of Huffman tree information. That is, generating the items of Huffman tree information until neither the leaf node queue 51A-1 nor the intermediate node queue 51A-2 stores a node having no parent node corresponds to generating the Huffman tree.

Figure 9:
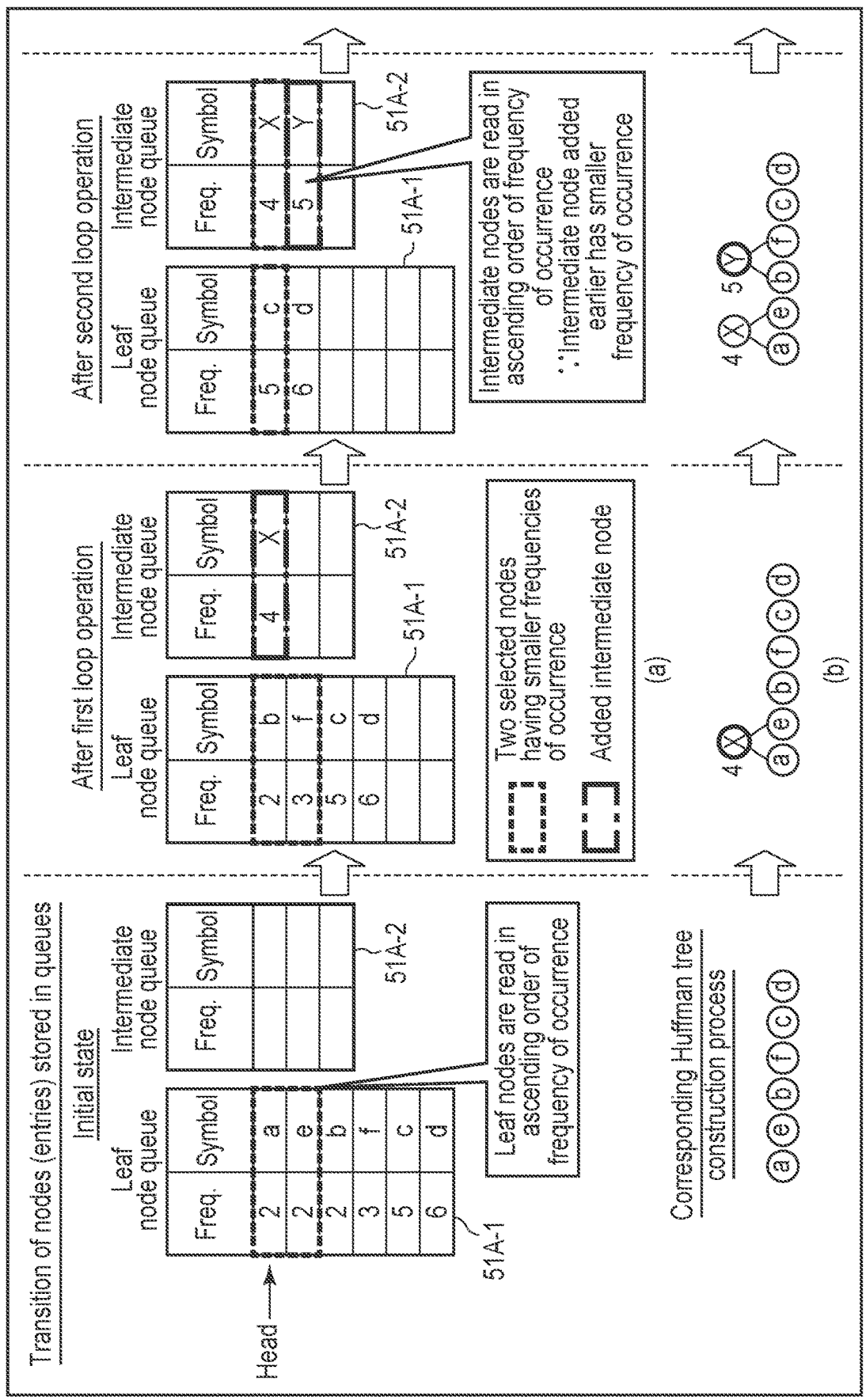
FIG. 9 is a diagram illustrating an example of (a) transition of nodes (entries) stored in a leaf node queue and an intermediate node queue and (b) a corresponding Huffman tree construction process, in the code table generation device according to the comparative example.
Figure 10:
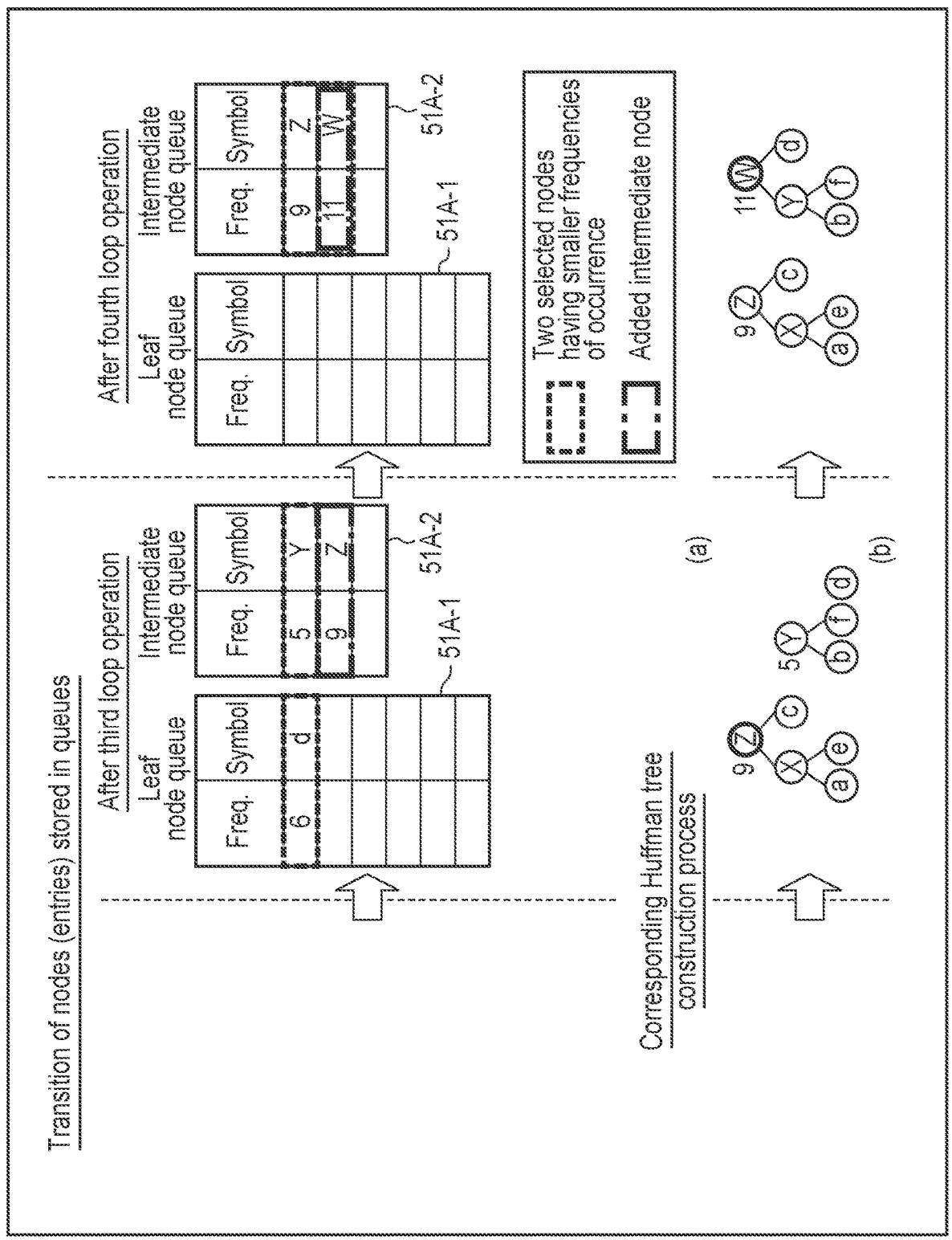
FIG. 10 is a diagram illustrating an example of (a) transition of nodes stored in the leaf node queue and the intermediate node queue and (b) the corresponding Huffman tree construction process subsequent to FIG. 9.

FIGS. 9 and 10 illustrate an example of (a) transition of nodes (entries) stored in the leaf node queue 51A-1 and the intermediate node queue 51A-2 and (b) a corresponding Huffman tree construction process, in the Huffman tree generation by the Huffman tree generation unit 323A of the comparative example. Hereinafter, the transition of nodes stored in the leaf node queue 51A-1 and the intermediate node queue 51A-2 and the corresponding Huffman tree construction process will be described in order of an initial state and a state each time the loop operation in the Huffman tree generation unit 323A described above is performed. In part of FIGS. 9 and 10, "frequency of occurrence" is abbreviated as "freq."

(Initial State)

As illustrated in FIG. 9(a), in the initial state, entries in the sorted frequency table are stored in storage areas of the leaf node queue 51A-1 in the FIFO manner. Each of the stored entries corresponds to a leaf node included in a Huffman tree.

Here, it is assumed that six entries sorted in ascending order of frequency of occurrence are stored in order from the head of the leaf node queue 51A-1. The stored six entries are, in order from the head of the leaf node queue 51A-1, an entry of a symbol "a" whose frequency of occurrence is two, an entry of a symbol "e" whose frequency of occurrence is two, an entry of a symbol "b" whose frequency of occurrence is two, an entry of a symbol "f" whose frequency of occurrence is three, an entry of a symbol "c" whose frequency of occurrence is five, and an entry of a symbol "d" whose frequency of occurrence is six. In the leaf node queue 51A-1, the six entries are read in ascending order of frequency of occurrence. Hereinafter, these six entries are also referred to as leaf nodes "a", "e", "b", "f", "c", and "d".

In the initial state, no entry (intermediate node) is stored in storage areas of the intermediate node queue 51A-2.

As illustrated in FIG. 9(b), the leaf node queue 51A-1 and the intermediate node queue 51A-2 in the initial state correspond to a Huffman tree that includes the six leaf nodes "a", "e", "b", "f", "c", and "d", none of which have a parent node.

(First Loop Operation)

In the first loop operation, the node selection unit 415A reads, from the leaf node queue 51A-1 in the initial state, the two leaf nodes "a" and "e" having a smaller frequency of occurrence (that is, reads two leaf nodes from the head of the leaf node queue 51A-1). Since no intermediate node is stored in the intermediate node queue 51A-2 in the initial state, the node selection unit 415A does not read any intermediate node from the intermediate node queue 51A-2. Then, as illustrated in FIG. 9(a), the node selection unit 415A selects the read two leaf nodes "a" and "e" as two selected nodes having a smaller frequency of occurrence in the leaf node queue 51A-1 and the intermediate node queue 51A-2.

Next, the intermediate node generation unit 416A generates an intermediate node "X" that has the leaf node "a" and the leaf node "e" as children. The intermediate node generation unit 416A sets four (=2+2), which is the sum of the frequencies of occurrence of the leaf node "a" and the leaf node "e", as a frequency of occurrence of the generated intermediate node "X". Then, the intermediate node generation unit 416A adds an entry of the intermediate node "X" to the intermediate node queue 51A-2. The entry of the intermediate node "X" includes, for example, the frequency of occurrence, identification information, and child node information of the intermediate node "X". The child node information of the intermediate node "X" includes information indicative of the leaf node "a" and the leaf node "e", which are child nodes. The information included in the entry of the intermediate node "X" is output to, for example, the outside of the Huffman tree generation unit 323A as Huffman tree information.

Since the two leaf nodes "a" and "e" have been selected as the two selected nodes, the node selection unit 415A performs the pop operation on the leaf node queue 51A-1 twice. As a result, in the leaf node queue 51A-1, the two leaf nodes "a" and "e" are deleted from the head, and the subsequent leaf nodes "b", "f", "c", and "d" are shifted twice in the head direction.

As illustrated in FIG. 9(b), the leaf node queue 51A-1 and the intermediate node queue 51A-2 after the first loop operation correspond to the Huffman tree to which the intermediate node "X" having the leaf node "a" and the leaf node "e" as children is added.

(Second Loop Operation)

In the second loop operation, the node selection unit 415A reads the two leaf nodes "b" (whose frequency of occurrence is two) and "f" (whose frequency of occurrence is three) having smaller frequencies of occurrence from the leaf node queue 51A-1 after the first loop operation. Since only one intermediate node is stored in the intermediate node queue 51A-2 after the first loop operation, the node selection unit 415A reads the intermediate node "X" (whose frequency of occurrence is four) from the intermediate node queue 51A-2. Then, as illustrated in FIG. 9(a), from the two leaf nodes "b" and "f" and the intermediate node "X", the node selection unit 415A selects the leaf node "b" and the leaf node "f" as two selected nodes having smaller frequencies of occurrence in the leaf node queue 51A-1 and the intermediate node queue 51A-2.

Next, the intermediate node generation unit 416A generates an intermediate node "Y" having the leaf node "b" and the leaf node "f" as children. The intermediate node generation unit 416A sets five (=2+3), which is the sum of the frequencies of occurrence of the leaf node "b" and the leaf node "f", as a frequency of occurrence of the generated intermediate node "Y". Then, the intermediate node generation unit 416A adds an entry of the intermediate node "Y" to the intermediate node queue 51A-2. The entry of the intermediate node "Y" includes, for example, the frequency of occurrence, identification information, and child node information of the intermediate node "Y". The child node information of the intermediate node "Y" includes information indicative of the leaf node "b" and the leaf node "f", which are child nodes. The information included in the entry of the intermediate node "Y" is output to, for example, the outside of the Huffman tree generation unit 323A as Huffman tree information.

Since the two leaf nodes "b" and "f" have been selected as the two selected nodes, the node selection unit 415A performs the pop operation on the leaf node queue 51A-1 twice. As a result, in the leaf node queue 51A-1, the two leaf nodes "b" and "f" are deleted from the head, and the subsequent leaf nodes "c" and "d" are shifted twice in the head direction.

As illustrated in FIG. 9(b), the leaf node queue 51A-1 and the intermediate node queue 51A-2 after the second loop operation correspond to the Huffman tree to which the intermediate node "Y" having the leaf node "b" and the leaf node "f" as children is added.

(Third Loop Operation)

In the third loop operation, the node selection unit 415A reads the two leaf nodes "c" (whose frequency of occurrence is five) and "d" (whose frequency of occurrence is six) having smaller frequencies of occurrence from the leaf node queue 51A-1 after the second loop operation. The node selection unit 415A reads the two intermediate nodes "X" (whose frequency of occurrence is four) and "Y" (whose frequency of occurrence is five) having smaller frequencies of occurrence from the intermediate node queue 51A-2 after the second loop operation. Then, as illustrated in FIG. 9(a), from the two leaf nodes "c" and "d", the intermediate node "X", and the intermediate node "Y", the node selection unit 415A selects the intermediate node "X" and the leaf node "c" as two selected nodes having smaller frequencies of occurrence in the leaf node queue 51A-1 and the intermediate node queue 51A-2. Here, the leaf node "c" is selected from the leaf node "c" and the intermediate node "Y" that have the same frequency of occurrence, but the intermediate node "Y" may be selected instead.

Next, the intermediate node generation unit 416A generates an intermediate node "Z" having the intermediate node "X" and the leaf node "c" as children. The intermediate node generation unit 416A sets nine (=4+5), which is the sum of the frequencies of occurrence of the intermediate node "X" and the leaf node "c", as a frequency of occurrence of the generated intermediate node "Z". Then, as illustrated in FIG. 10(a), the intermediate node generation unit 416A adds an entry of the intermediate node "Z" to the intermediate node queue 51A-2. The entry of the intermediate node "Z" includes, for example, the frequency of occurrence, identification information, and child node information of the intermediate node "Z". The child node information of the intermediate node "Z" includes information indicative of the intermediate node "X" and the leaf node "c", which are child nodes. The information included in the entry of the intermediate node "Z" is output to, for example, the outside of the Huffman tree generation unit 323A as Huffman tree information.

Since the one leaf node "c" has been selected as one of the two selected nodes, the node selection unit 415A performs the pop operation on the leaf node queue 51A-1 once. As a result, in the leaf node queue 51A-1, the one leaf node "c" is deleted from the head, and the subsequent leaf node "d" is shifted once in the head direction.

Since the one intermediate node "X" has been selected as one of the two selected nodes, the node selection unit 415A performs the pop operation on the intermediate node queue 51A-2 once. As a result, in the intermediate node queue 51A-2, the one intermediate node "X" is deleted from the head, and the subsequent intermediate nodes Y and Z are shifted once in the head direction.

As illustrated in FIG. 10(b), the leaf node queue 51A-1 and the intermediate node queue 51A-2 after the third loop operation correspond to the Huffman tree to which the intermediate node "Z" having the intermediate node "X" and the leaf node "c" as children is added.

(Fourth Loop Operation)

In the fourth loop operation, since only one leaf node is stored in the leaf node queue 51A-1 after the third loop operation, the node selection unit 415A reads the one leaf node "d" (whose frequency of occurrence is six). The node selection unit 415A reads the two intermediate nodes "Y" (whose frequency of occurrence is five) and "Z" (whose frequency of occurrence is nine) having smaller frequencies of occurrence from the intermediate node queue 51A-2 after the third loop operation. Then, as illustrated in FIG. 10(a), from the leaf node "d", the intermediate node "Y", and the intermediate node "Z", the node selection unit 415A selects the intermediate node "Y" and the leaf node "d" as two selected nodes having smaller frequencies of occurrence in the leaf node queue 51A-1 and the intermediate node queue 51A-2.

Next, the intermediate node generation unit 416A generates an intermediate node "W" having the intermediate node "Y" and the leaf node "d" as children. The intermediate node generation unit 416A sets 11 (=5+6), which is the sum of the frequencies of occurrence of the intermediate node "Y" and the leaf node "d", as a frequency of occurrence of the generated intermediate node "W". Then, as illustrated in FIG. 10($a$), the intermediate node generation unit 416A adds an entry of the intermediate node "W" to the intermediate node queue 51A-2. The entry of the intermediate node "W" includes, for example, the frequency of occurrence, identification information, and child node information of the intermediate node "W". The child node information of the intermediate node "W" includes information indicative of the intermediate node "Y" and the leaf node "d", which are child nodes. The information included in the entry of the intermediate node "W" is output to, for example, the outside of the Huffman tree generation unit 323A as Huffman tree information.

Since the one leaf node "d" has been selected as one of the two selected nodes, the node selection unit 415A performs the pop operation on the leaf node queue 51A-1 once. As a result, in the leaf node queue 51A-1, the one leaf node "d" is deleted from the head.

Since the one intermediate node "Y" has been selected as one of the two selected nodes, the node selection unit 415A performs the pop operation on the intermediate node queue 51A-2 once. As a result, in the intermediate node queue 51A-2, the one intermediate node "Y" is deleted from the head, and the subsequent intermediate nodes "Z" and "W" are shifted once in the head direction.

As illustrated in FIG. 10($b$), the leaf node queue 51A-1 and the intermediate node queue 51A-2 after the fourth loop operation correspond to the Huffman tree to which the intermediate node "W" having the intermediate node "Y" and the leaf node "d" as children is added.

The leaf node queue 51A-1 and the intermediate node queue 51A-2 after the fourth loop operation are in a state in which only two nodes (that is, the intermediate nodes "Z" and "W") having no parent node remain. The parent node of the two remaining nodes is the root node of the Huffman tree. Therefore, the generation of the Huffman tree in the Huffman tree generation unit 323A is completed.

In the Huffman tree generation unit 323A of the comparative example, it is not necessary to sort the entries (nodes) based on the frequencies of occurrence other than using the sorted frequency table in the initial state. The Huffman tree generation unit 323A can construct the Huffman tree only by repeating the loop operation of reading four leaf/intermediate nodes from the leaf node queue 51A-1 and the intermediate node queue 51A-2, selecting two nodes having smaller frequencies of occurrence, and generating an intermediate node. Therefore, in the Huffman tree generation unit 323A, a processing amount for constructing the Huffman tree can be reduced.

However, in the Huffman tree generation unit 323A of the comparative example, it is necessary to provide not only the leaf node queue 51A-1 but also the intermediate node queue 51A-2. As a result, in the Huffman tree generation unit 323A of the comparative example, the circuit scale (for example, the number of gates) increases.

In contrast, in the code table generation device 32 according to the present embodiment, the circuit scale for constructing a Huffman tree is reduced. Specifically, in the Huffman tree generation unit 323 in the code table generation device 32, leaf nodes and intermediate nodes share a storage area (for example, a queue) used for storage. In this case, since it is not necessary to provide a dedicated storage area for each of the storage of the leaf nodes and the storage of the intermediate nodes, the size of the storage area included in the Huffman tree generation unit 323 for storing the leaf nodes and the intermediate nodes can be reduced. Furthermore, since the physically same storage area is shared for storing the leaf nodes and the intermediate nodes, the circuit scale of the Huffman tree generation unit 323 can be reduced.

FIG. 11 is a block diagram illustrating an example of a configuration of the Huffman tree generation unit 323 included in the code table generation device 32. The Huffman tree generation unit 323 includes, for example, a queue 51, a leaf node RdPtr control unit 411, a multiplexer 412, an intermediate node RdPtr control unit 413, a multiplexer 414, a node selection unit 415, an intermediate node generation unit 416, a Huffman tree information generation unit 417, an intermediate node WrPtr control unit 418, and a demultiplexer 419.

The queue 51 is a queue capable of storing node entries (i.e., entries of nodes). The queue 51 is connected to each of the multiplexers 412 and 414 and to the demultiplexer 419. The queue 51 includes, for example, a flip-flop circuit. The queue 51 includes an array including N storage areas. The N storage areas are specified by, for example, an index range from 0 to N−1. An index of the index range identifies one of the N storage areas. Each of the N storage areas is capable of storing, for example, a leaf node entry or an intermediate node entry. That is, each of the N storage areas is a storage area shared for storage of a leaf node entry and storage of an intermediate node entry. More specifically, each of the N storage areas is allocated, at a specific timing, as either a storage area in which a leaf node entry is stored or a storage area in which an intermediate node entry is stored. One or more storage areas in which one or more leaf node entries are stored are referred to as a leaf node queue range. One or more storage areas in which one or more intermediate node entries are stored is referred to as an intermediate node queue range. For example, at a certain timing, a first storage area among the N storage areas is allocated as the leaf node queue range. At another timing, the first storage area is allocated as the intermediate node queue range.

A leaf node entry includes, for example, data indicative of a symbol, a frequency of occurrence, and a node type of a corresponding leaf node. The node type indicates either a leaf node or an intermediate node.

An intermediate node entry includes, for example, data indicative of identification information, a frequency of occurrence, child node information, and a node type of a corresponding intermediate node. The identification information of the intermediate node is information by which the corresponding intermediate node is uniquely identifiable. The child node information is information related to two nodes that are had as children by the corresponding intermediate node. The child node information includes, for example, at least one of information indicative of a symbol assigned to a child leaf node and identification information of a child intermediate node.

In an initial state, the queue 51 stores the sorted frequency table 38. Specifically, the storage areas in the queue 51 that correspond to the specified index range store, in order from the head, the respective entries in the sorted frequency table 38. Each of the stored entries is a leaf node entry included in a Huffman tree. Hereinafter, a leaf node entry stored in a storage area in the queue 51 is also simply referred to as a leaf node. An intermediate node entry stored in a storage area in the queue 51 is also simply referred to as an intermediate node.

The leaf node RdPtr control unit 411 controls a leaf node read pointer RdPtrL. The leaf node read pointer RdPtrL indicates the head of the leaf node queue range in the queue 51. The leaf node queue range includes one or more storage areas that each store a leaf node having no parent node. The one or more storage areas allocated as the leaf node queue range are capable of storing one or more leaf nodes that are arranged in ascending order of frequency of occurrence, in order from the head of the leaf node queue range. The leaf node queue range is specified by an index range of the array. In a case where the entries in the sorted frequency table 38 are sorted in ascending order of frequency of occurrence, the read pointer RdPtrL indicates, in the initial state, an index corresponding to a storage area that stores a head entry among the entries in the sorted frequency table 38. In a case where the entries in the sorted frequency table 38 are sorted in descending order of frequency of occurrence, the read pointer RdPtrL indicates, in the initial state, an index corresponding to a storage area that stores a tail entry among the entries in the sorted frequency table 38. For example, the leaf node RdPtr control unit 411 sets the read pointer RdPtrL to 0 in the initial state. In a case where the entries in the sorted frequency table 38 are sorted in ascending order of frequency of occurrence, an index indicative of the tail of the leaf node queue range indicates, in the initial state, an index corresponding to a storage area that stores a tail entry among the entries in the sorted frequency table 38. In a case where the entries in the sorted frequency table 38 are sorted in descending order of frequency of occurrence, the index indicative of the tail of the leaf node queue range indicates, in the initial state, an index corresponding to a storage area that stores a head entry among the entries in the sorted frequency table 38. The leaf node RdPtr control unit 411 sends the read pointer RdPtrL to the multiplexer 412.

The multiplexer 412 acquires two leaf nodes stored in the queue 51, based on the read pointer RdPtrL received from the leaf node RdPtr control unit 411. Specifically, the multiplexer 412 identifies two storage areas corresponding to two indexes from the read pointer RdPtrL in a direction approaching the tail of the leaf node queue range. Then, the multiplexer 412 acquires two leaf nodes that are stored in the identified two storage areas, respectively. The multiplexer 412 sends the acquired two leaf nodes to the node selection unit 415. Note that in a case where only one leaf node is stored in the queue 51, the multiplexer 412 acquires the leaf node and sends the leaf node to the node selection unit 415. In a case where no leaf node is stored in the queue 51, the multiplexer 412 does not acquire any leaf node.

The intermediate node RdPtr control unit 413 controls an intermediate node read pointer RdPtrB. The intermediate node read pointer RdPtrB indicates the head of the intermediate node queue range in the queue 51. The intermediate node queue range includes one or more storage areas each capable of storing an intermediate node having no parent node. The one or more storage areas allocated as the intermediate node queue range are capable of storing one or more intermediate nodes that are arranged in ascending order of frequency of occurrence, respectively, in order from the head of the intermediate node queue range. In the intermediate node queue range, the intermediate nodes are stored in the FIFO manner. The intermediate node queue range is specified by an index range of the array. In the initial state, the intermediate node read pointer RdPtrB is equal to the leaf node read pointer RdPtrL. For example, the intermediate node RdPtr control unit 413 sets the read pointer RdPtrB to 0 in the initial state. The intermediate node RdPtr control unit 413 sends the read pointer RdPtrB to the multiplexer 414.

The multiplexer 414 acquires two intermediate nodes stored in the queue 51, based on the read pointer RdPtrB received from the intermediate node RdPtr control unit 413. Specifically, the multiplexer 414 identifies two storage areas corresponding to two indexes from the read pointer RdPtrB in a direction approaching an intermediate node write pointer WrPtrB, which is to be described later. Then, the multiplexer 414 acquires two intermediate nodes that are stored in the identified two storage areas, respectively. The multiplexer 414 sends the acquired two intermediate nodes to the node selection unit 415. Note that in a case where only one intermediate node is stored in the queue 51, the multiplexer 414 acquires the intermediate node and sends the intermediate node to the node selection unit 415. In a case where no intermediate node is stored in the queue 51, the multiplexer 412 does not acquire any intermediate node.

The node selection unit 415 selects two nodes having smaller frequencies of occurrence from at most two leaf nodes received from the multiplexer 412 and at most two intermediate nodes received from the multiplexer 414. That is, the node selection unit 415 selects the first node and the second node in a case where at most four leaf/intermediate nodes are sorted in ascending order of frequency of occurrence. The node selection unit 415 notifies the leaf node RdPtr control unit 411 of the number L of leaf nodes among the two selected nodes. The node selection unit 415 notifies the intermediate node RdPtr control unit 413 and the intermediate node WrPtr control unit 418 of the number M of intermediate nodes among the two selected nodes. The node selection unit 415 sends the two selected nodes to the intermediate node generation unit 416.

The intermediate node generation unit 416 generates an intermediate node having the two selected nodes received from the node selection unit 415 as children. The intermediate node generation unit 416 sets the sum of the frequencies of occurrence of the two selected nodes, as a frequency of occurrence of the generated intermediate node. The intermediate node generation unit 416 sends the generated intermediate node to the Huffman tree information generation unit 417 and the demultiplexer 419.

The Huffman tree information generation unit 417 generates Huffman tree information corresponding to the intermediate node received from the intermediate node generation unit 416. The Huffman tree information includes, for example, identification information and child node information of the intermediate node. The Huffman tree information generation unit 417 sends the generated Huffman tree information to the outside of the Huffman tree generation unit 323 (for example, the code length determination unit 324).

The intermediate node WrPtr control unit 418 controls the intermediate node write pointer WrPtrB. The intermediate node write pointer WrPtrB indicates a storage area in the queue 51 to which an intermediate node is newly written. The intermediate node write pointer WrPtrB indicates, for example, the tail of the intermediate node queue range. In the initial state, the intermediate node write pointer WrPtrB is equal to the leaf node read pointer RdPtrL. For example, the intermediate node WrPtr control unit 418 sets the write pointer WrPtrB to 0 in the initial state. In the queue 51, an intermediate node may be newly stored in a storage area that is specified by the write pointer WrPtrB. The intermediate node WrPtr control unit 418 sends the write pointer WrPtrB to the demultiplexer 419.

The demultiplexer 419 writes the intermediate node (that is, an entry of the intermediate node) received from the intermediate node generation unit 416 to the queue 51, based on the write pointer WrPtrB received from the intermediate node WrPtr control unit 418. Specifically, the demultiplexer 419 identifies one storage area in the queue 51 by using the write pointer WrPtrB. Then, the demultiplexer 419 writes the intermediate node in the identified storage area. As a result, the newly generated intermediate node can be stored in the queue 51.

Here, update methods of the leaf node read pointer RdPtrL, the intermediate node read pointer RdPtrB, and the intermediate node write pointer WrPtrB will be described.

FIG. 12 illustrates an example of the initial value and the update method of each pointer.

As described above, the initial values of the leaf node read pointer RdPtrL, the intermediate node read pointer RdPtrB, and the intermediate node write pointer WrPtrB are all 0.

When the node selection unit 415 has notified the leaf node RdPtr control unit 411 of the number L of leaf nodes among two selected nodes, the leaf node RdPtr control unit 411 updates the read pointer RdPtrL by adding the number L of leaf nodes among two selected nodes to a current value of the read pointer RdPtrL. The leaf node RdPtr control unit 411 sends the updated read pointer RdPtrL to the multiplexer 412.

When the node selection unit 415 has notified the intermediate node RdPtr control unit 413 of the number M of intermediate nodes among two selected nodes, the intermediate node RdPtr control unit 413 updates the read pointer RdPtrB by adding the number M of intermediate nodes among two selected nodes to a current value of the read pointer RdPtrB. The intermediate node RdPtr control unit 413 sends the updated read pointer RdPtrB to the multiplexer 414.

When the node selection unit 415 has notified the intermediate node WrPtr control unit 418 of the number M of intermediate nodes among two selected nodes, the intermediate node WrPtr control unit 418 updates the write pointer WrPtrB by adding one to a current value of the write pointer WrPtrB. The intermediate node WrPtr control unit 418 sends the updated write pointer WrPtrB to the demultiplexer 419.

One cycle of operation by the leaf node RdPtr control unit 411, the multiplexer 412, the intermediate node RdPtr control unit 413, the multiplexer 414, the node selection unit 415, the intermediate node generation unit 416, the Huffman tree information generation unit 417, the intermediate node WrPtr control unit 418, and the demultiplexer 419 is one loop operation in the Huffman tree generation unit 323. This loop operation is repeatedly performed until the queue 51 does not store any node having no parent node. Each time the loop operation is repeated, the Huffman tree information generation unit 417 generates an item of Huffman tree information corresponding to a newly generated intermediate node. The generated item of Huffman tree information includes information that indicates at least one of a leaf node and an intermediate node that are included in a Huffman tree. Therefore, the Huffman tree generation unit 323 can generate the Huffman tree corresponding to the sorted frequency table 38 by using all generated items of Huffman tree information. That is, generating the items of Huffman tree information until the queue 51 does not store any node having no parent node corresponds to generating the Huffman tree. Therefore, the code length determination unit 324 can acquire the Huffman tree corresponding to the sorted frequency table 38 by using all the generated items of Huffman tree information. Then, the code length determination unit 324 can determine a code length for each symbol of the input symbols, based on the acquired Huffman tree.

Figure 13:
FIG. 13 is a diagram illustrating an example of transition of nodes stored in a queue and pointers, in Huffman tree generation by the Huffman tree generation unit of FIG. 11.

FIG. 13 illustrates an example of transition of nodes (entries) stored in the queue 51 and pointers, in the Huffman tree generation by the Huffman tree generation unit 323. Hereinafter, with respect to the transition of nodes stored in the queue 51 and pointers, an initial state and a state every time the loop operation is performed in the Huffman tree generation unit 323 described above will be described in order. In part of FIG. 13, "frequency of occurrence" is abbreviated as "freq.", and "intermediate" is abbreviated as "inter."

(Initial State)

In the initial state, storage areas in the queue 51 corresponding to a specified index range store entries in the sorted frequency table 38, respectively, in order from the head. Each of the stored entries corresponds to a leaf node included in a Huffman tree.

Here, it is assumed that six storage areas corresponding to an index range from 0 to 5 store six entries sorted in ascending order of frequency of occurrence, in order from the head of the six storage areas. That is, the six storage areas from an index 0 to an index 5 store the six entries sorted in ascending order of frequency of occurrence, respectively. The entry stored in the storage area of the index 0 is an entry of a symbol "a" whose frequency of occurrence is two. The entry stored in the storage area of the index 1 is an entry of a symbol "e" whose frequency of occurrence is two. The entry stored in the storage area of the index 2 is an entry of a symbol "b" whose frequency of occurrence is two. The entry stored in the storage area of the index 3 is an entry of a symbol "f" whose frequency of occurrence is three. The entry stored in the storage area of the index 4 is an entry of a symbol "c" whose frequency of occurrence is five. The entry stored in the storage area of the index 5 is an entry of a symbol "d" whose frequency of occurrence is six. The node types of the six entries are all "leaf". Hereinafter, these six entries are also referred to as leaf nodes "a", "e", "b", "f", "c", and "d".

No intermediate node is stored in any of the storage areas of the queue 51.

Therefore, in the initial state, a leaf node queue range 51L is the six storage areas that are specified by the index range from the index 0 to the index 5.

The leaf node read pointer RdPtrL, the intermediate node read pointer RdPtrB, and the intermediate node write pointer WrPtrB0 are set to 0 as initial values. That is, the leaf node read pointer RdPtrL, the intermediate node read pointer RdPtrB, and the intermediate node write pointer WrPtrB are set to the index 0 indicative of the head of the index range.

(First Loop Operation)

In the first loop operation, the multiplexer 412 acquires the two leaf nodes "a" and "e" from the queue 51 in the initial state, based on the leaf node read pointer RdPtrL. Since no intermediate node is stored in the queue 51 in the initial state, the multiplexer 414 does not acquire any intermediate node. Accordingly, the node selection unit 415 receives the two leaf nodes "a" and "e" from the multiplexer 412. Then, the node selection unit 415 selects the received two leaf nodes "a" and "e" as two selected nodes having a smaller frequency of occurrence in the queue 51.

The intermediate node generation unit 416 generates an intermediate node "X" having the selected leaf node "a" and leaf node "e" as children. The intermediate node generation unit 416 sets four (=2+2), which is the sum of the frequencies of occurrence of the leaf node "a" and the leaf node "e", as a frequency of occurrence of the generated intermediate node "X". Then, the demultiplexer 419 writes an entry of the intermediate node "X" in the storage area in the queue 51 indicated by the intermediate node write pointer WrPtrB (that is, the storage area of the index 0). That is, the demultiplexer 419 overwrites the entry of the leaf node "a" with the entry of the intermediate node "X". The entry of the intermediate node "X" includes, for example, the frequency of occurrence, identification information, and child node information of the intermediate node "X". The child node information of the intermediate node "X" includes information indicative of the leaf node "a" and the leaf node "e", which are child nodes. Since the information of the leaf node "a" is included in the child node information of the intermediate node "X", the leaf node "a" having been selected as the selected node enables reallocation of the storage area storing the entry of the leaf node "a". The demultiplexer 419 can allocate the storage area storing the entry of the leaf node "a" as an intermediate node queue range 51B and use the storage area for storing the entry of the intermediate node "X". Similarly, the leaf node "e" having been selected as the selected node enables reallocation of the storage area storing the entry of the leaf node "e". The demultiplexer 419 can allocate the storage area storing the entry of the leaf node "e" as the intermediate node queue range 51B and use the storage area for storing an entry of a new intermediate node. The information included in the entry of the intermediate node "X" is output to, for example, the outside of the Huffman tree generation unit 323 as Huffman tree information.

Since the two leaf nodes "a" and "e" have been selected as the two selected nodes, the leaf node RdPtr control unit 411 adds two to the leaf node read pointer RdPtrL. Therefore, the read pointer RdPtrL is set to the index 2.

Since no intermediate node has been selected as the two selected nodes, the intermediate node RdPtr control unit 413 does not update the intermediate node read pointer RdPtrB. Therefore, the read pointer RdPtrB is maintained at the index 0.

The intermediate node WrPtr control unit 418 adds one to the intermediate node write pointer WrPtrB. Therefore, the write pointer WrPtrB is set to the index 1.

By the first loop operation described above, the leaf node queue range 51L becomes four storage areas that are specified by an index range from the index 2, which is indicated by the leaf node read pointer RdPtrL, to the index 5. The intermediate node queue range 51B is two storage areas that are specified by an index range from the index 0 to the index 1 immediately before the leaf node read pointer RdPtrL. The intermediate node queue range 51B is a range including at least one of a storage area storing an intermediate node and a storage area capable of newly storing an intermediate node.

(Second Loop Operation)

In the second loop operation, the multiplexer 412 acquires the two leaf nodes "b" and "f" from the queue 51 after the first loop operation, based on the leaf node read pointer RdPtrL. The multiplexer 414 acquires the intermediate node "X" from the queue 51 after the first loop operation, based on the intermediate node read pointer RdPtrB. When acquiring two nodes based on the intermediate node read pointer RdPtrB, the multiplexer 414 acquires the intermediate node "X" and the leaf node "e", which is already has a parent node. In this case, since the leaf node "e" is not an intermediate node (more specifically, in the entry of the leaf node "e", the node type is "leaf"), the multiplexer 414 sends only the intermediate node "X" to the node selection unit 415. Therefore, the node selection unit 415 receives the two leaf nodes "b" and "f" from the multiplexer 412 and receives the intermediate node "X" from the multiplexer 414. Then, from the two leaf nodes "b" (whose frequency of occurrence is two) and "f" (whose frequency of occurrence three) and the intermediate node "X" (whose frequency of occurrence is four), the node selection unit 415 selects the leaf nodes "b" and "f" as two selected nodes having smaller frequencies of occurrence.

The intermediate node generation unit 416 generates an intermediate node "Y" having the selected leaf node "b" and leaf node "f" as children. The intermediate node generation unit 416 sets five (=2+3), which is the sum of the frequencies of occurrence of the leaf node "b" and the leaf node "f", as a frequency of occurrence of the generated intermediate node "Y". Then, the demultiplexer 419 writes an entry of the intermediate node "Y" in the storage area in the queue 51 indicated by the intermediate node write pointer WrPtrB (that is, the storage area of the index 1). That is, the demultiplexer 419 overwrites the entry of the leaf node "e" with the entry of the intermediate node "Y". The entry of the intermediate node "Y" includes, for example, the frequency of occurrence, identification information, and child node information of the intermediate node "Y". The child node information of the intermediate node "Y" includes information indicative of the leaf node "b" and the leaf node "f", which are child nodes. Therefore, since the information of the leaf node "b" and the leaf node "f" is included in the child node information of the intermediate node "Y", the leaf node "b" and the leaf node "f" having been selected as the selected nodes enables reallocation of the storage areas storing the leaf node "b" and the leaf node "f" (that is, the storage areas of the indexes 2 and 3). The demultiplexer 419 can allocate the storage areas storing the leaf node "b" and the leaf node "f" as the intermediate node queue range 51B and use the storage areas for storing entries of new intermediate nodes. The information included in the entry of the intermediate node "Y" is output to, for example, the outside of the Huffman tree generation unit 323 as Huffman tree information.

Since the two leaf nodes "b" and "f" have been selected as the two selected nodes, the leaf node RdPtr control unit 411 adds two to the leaf node read pointer RdPtrL. Therefore, the read pointer RdPtrL is set to the index 4.

Since no intermediate node has been selected as the two selected nodes, the intermediate node RdPtr control unit 413 does not update the intermediate node read pointer RdPtrB. Therefore, the read pointer RdPtrB is maintained at the index 0.

The intermediate node WrPtr control unit 418 adds one to the intermediate node write pointer WrPtrB. Therefore, the write pointer WrPtrB is set to the index 2.

By the second loop operation described above, the leaf node queue range 51L becomes two storage areas that are specified by an index range from the index 4, which is indicated by the leaf node read pointer RdPtrL, to the index 5. The intermediate node queue range 51B becomes four storage areas that are specified by an index range from the index 0 to the index 3 immediately before the leaf node read pointer RdPtrL.

(Third Loop Operation)

In the third loop operation, the multiplexer 412 acquires two leaf nodes "c" and "d" from the queue 51 after the second loop operation, based on the leaf node read pointer RdPtrL. The multiplexer 414 acquires the intermediate node "X" and the intermediate node "Y" from the queue 51 after the second loop operation, based on the intermediate node read pointer RdPtrB. Therefore, the node selection unit 415 receives the two leaf nodes "c" and "d" from the multiplexer 412, and receives the intermediate node "X" and the intermediate node "Y" from the multiplexer 414. Then, from the two leaf nodes "c" (whose frequency of occurrence is five) and "d" (whose frequency of occurrence is six), the intermediate node "X" (whose frequency of occurrence is four), and the intermediate node "Y" (whose frequency of occurrence is five), the node selection unit 415 selects the intermediate node "X" and the leaf node "c" as two selected nodes having smaller frequencies of occurrence. Here, although a case where the leaf node "c" is selected from the leaf node "c" and the intermediate node "Y" that have the same frequency of occurrence, which is five, is explained as an example, the node selection unit 415 may select the intermediate node "Y" instead of the leaf node "c".

Next, the intermediate node generation unit 416 generates an intermediate node "Z" having the intermediate node "X" and the leaf node "c" as children. The intermediate node generation unit 416 sets nine (=4+5), which is the sum of the frequencies of occurrence of the intermediate node "X" and the leaf node "c", as a frequency of occurrence of the generated intermediate node "Z". Then, the demultiplexer 419 writes an entry of the intermediate node "Z" in the storage area in the queue 51 indicated by the intermediate node write pointer WrPtrB (that is, the storage area of the index 2). That is, the demultiplexer 419 overwrites the entry of the leaf node "b" with the entry of the intermediate node "Z". The entry of the intermediate node "Z" includes, for example, the frequency of occurrence, identification information, and child node information of the intermediate node "Z". The child node information of the intermediate node "Z" includes information indicative of the intermediate node "X" and the leaf node "c", which are child nodes. Since the information of the leaf node "c" is included as the child node information of the intermediate node "Z", the leaf node "c" having been selected as the selected node enables reallocation of the storage area storing the leaf node "c" (that is, the storage area of the index 4). The demultiplexer 419 can allocate the storage area storing the entry of the leaf node "c" as the intermediate node queue range 51B and use the storage area for storing an entry of a new intermediate node. The information included in the entry of the intermediate node "Z" is output to, for example, the outside of the Huffman tree generation unit 323 as Huffman tree information.

Since the one leaf node "c" has been selected as one of the two selected nodes, the leaf node RdPtr control unit 411 adds one to the leaf node read pointer RdPtrL. Therefore, the read pointer RdPtrL is set to the index 5.

Since the one intermediate node "X" has been selected as one of the two selected nodes, the intermediate node RdPtr control unit 413 adds one to the intermediate node read pointer RdPtrB. Therefore, the read pointer RdPtrB is set to the index 1.

The intermediate node WrPtr control unit 418 adds one to the intermediate node write pointer WrPtrB. Therefore, the write pointer WrPtrB is set to the index 3.

By the third loop operation described above, in the queue 51, the leaf node queue range 51L becomes one storage area of the index 5 indicated by the leaf node read pointer RdPtrL. The intermediate node queue range 51B becomes five storage areas specified by an index range from the index 0 to the index 4 immediately before the leaf node read pointer RdPtrL.

(Fourth Loop Operation)

In the fourth loop operation, the multiplexer 412 acquires the leaf node "d" from the queue 51 after the third loop operation, based on the leaf node read pointer RdPtrL. That is, since the read pointer RdPtrL is set to the index 5 (tail index), the multiplexer 412 acquires only the one leaf node "d". The multiplexer 414 acquires the intermediate node "Y" and the intermediate node "Z" from the queue 51 after the third loop operation, based on the intermediate node read pointer RdPtrB. Therefore, the node selection unit 415 receives the one leaf node "d" from the multiplexer 412 and receives the intermediate node "Y" and the intermediate node "Z" from the multiplexer 414. Then, from the leaf node "d" (whose frequency of occurrence is six) and the two intermediate nodes "Y" (whose frequency of occurrence is five) and "Z" (whose frequency of occurrence is nine), the node selection unit 415 selects the intermediate node "Y" and the leaf node "d" as two selected nodes having smaller frequencies of occurrence.

The intermediate node generation unit 416 generates an intermediate node "W" having the selected intermediate node "Y" and leaf node "d" as children. The intermediate node generation unit 416 sets 11 (=5+6), which is the sum of the frequencies of occurrence of the intermediate node "Y" and the leaf node "d", as a frequency of occurrence of the generated intermediate node "W". Then, the demultiplexer 419 writes an entry of the intermediate node "W" in the storage area in the queue 51 indicated by the intermediate node write pointer WrPtrB (that is, the storage area of the index 3). That is, the entry of the leaf node "f" is overwritten with the entry of the intermediate node "W". The entry of the intermediate node "W" includes, for example, the frequency of occurrence, identification information, and child node information of the intermediate node "W". The child node information of the intermediate node "W" includes information indicative of the intermediate node "Y" and the leaf node "d", which are child nodes. Since the information of the leaf node "d" is included as the child node information of the intermediate node "Z", the leaf node "d" having been selected as the selected node enables reallocation of the storage area storing the leaf node "d" (that is, the storage area of the index 5). The demultiplexer 419 can allocate the storage area storing the entry of the leaf node "d" as the intermediate node queue range 51B and use the storage area for storing an entry of a new intermediate node. The information included in the entry of the intermediate node "W" is output to, for example, the outside of the Huffman tree generation unit 323 as Huffman tree information.

Since the one leaf node "d" has been selected as one of the two selected nodes, the leaf node RdPtr control unit 411 adds one to the leaf node read pointer RdPtrL. Therefore, the read pointer RdPtrL is set to an index 6.

Since the one intermediate node "Y" has been selected as one of the two selected nodes, the intermediate node RdPtr control unit 413 adds one to the intermediate node read pointer RdPtrB. Therefore, the read pointer RdPtrB is set to the index 2.

The intermediate node WrPtr control unit 418 adds one to the intermediate node write pointer WrPtrB. Therefore, the write pointer WrPtrB is set to the index 4.

By the fourth loop operation described above, the queue 51 includes no leaf node queue range 51L. The intermediate node queue range 51B becomes six storage areas that are specified by an index range from the index 0 to the index 5.

Furthermore, after the fourth loop operation, the number of nodes having no parent node stored in the queue 51 becomes two. For the two nodes having no parent node (here, the intermediate node "Z" and the intermediate node "W"), the root node of the Huffman tree is set as a parent node. Therefore, the generation of the Huffman tree in the Huffman tree generation unit 323 is completed.

As described above, in the Huffman tree generation unit 323 according to the first embodiment, the storage areas in the one queue 51 can be shared for storage of the leaf nodes and storage of the intermediate nodes. Specifically, in response to generation of a new intermediate node, the Huffman tree generation unit 323 uses the storage area in the queue 51 storing a leaf node that is had as a child by the intermediate node for storage of an intermediate node. As a result, as compared with a case where the leaf node queue 51A-1 and the intermediate node queue 51A-2 are separately provided as in the Huffman tree generation unit 323A of the comparative example, the size of the storage areas provided for storing the leaf nodes and the intermediate nodes can be reduced, and the circuit scale required for constructing the Huffman tree can be reduced.

Second Embodiment

In the code table generation device 32 according to the first embodiment, in the Huffman tree generation unit 323, the multiplexer 412 acquires a leaf node from the queue 51 on the basis of the leaf node read pointer RdPtrL, and the multiplexer 414 acquires an intermediate node from the queue 51 on the basis of the intermediate node read pointer RdPtrB. On the other hand, a code table generation device 32 according to a second embodiment acquires a leaf node and an intermediate node from specific storage areas in the queue 51 without using the multiplexers 412 and 414.

A configuration of a memory system 3 that includes the code table generation device 32 of the second embodiment is similar to that of the memory system 3 that includes the code table generation device 32 of the first embodiment. The code table generation device 32 of the second embodiment is different from the code table generation device 32 of the first embodiment in terms of a configuration of the Huffman tree generation unit 323. Hereinafter, the difference from the code table generation device 32 of the first embodiment will be mainly described.

FIG. 14 is a block diagram illustrating an example of a configuration of a Huffman tree generation unit 323 included in the code table generation device 32 of the second embodiment. The Huffman tree generation unit 323 includes, for example, a queue 51, a node selection unit 415, an intermediate node generation unit 416, a Huffman tree information generation unit 417, an intermediate node WrPtr control unit 418, a demultiplexer 419, and shift controllers 420.

The queue 51 is a queue capable of storing node entries. The queue 51 includes, for example, a shift register. The queue 51 includes an array including N storage areas. The N storage areas are specified by, for example, an index range from 0 to N−1. An index of the index range identifies one of the N storage areas. Each of the N storage areas is connected to at least one of the shift controllers 420. Of the N storage areas, N/2 storage areas corresponding to an index range from 0 to N/2−1 are used as a leaf node queue part 51-1. The remaining N/2 storage areas corresponding to an index range from N/2 to N−1 are used as a leaf/intermediate node queue part 51-2.

The leaf node queue part 51-1 is a part of the queue 51 that is capable of storing leaf node entries. Each of the N/2 storage areas in the leaf node queue part 51-1 is capable of storing one leaf node entry. That is, the storage areas in the leaf node queue part 51-1 are allocated as storage areas in which leaf node entries are to be stored.

The leaf/intermediate node queue part 51-2 is a part of the queue 51 that is capable of storing leaf node entries and intermediate node entries. Each of the N/2 storage areas in the leaf/intermediate node queue part 51-2 is capable of storing either one leaf node entry or one intermediate node entry. That is, each storage area of the leaf/intermediate node queue part 51-2 is a storage area shared by storage of a leaf node entry and storage of an intermediate node entry. Each storage area of the leaf/intermediate node queue part 51-2 is allocated as either a storage area storing a leaf node entry or a storage area storing an intermediate node entry, at a specific timing.

In a case where one or more leaf nodes are stored in the queue 51, the one or more leaf nodes in ascending order of frequency of occurrence are stored in one or more storage areas starting from a storage area of the head index 0 in a direction in which the index increases. The one or more leaf nodes are stored in the FIFO manner in order from the head index 0.

In a case where one or more intermediate nodes are stored in the queue 51, the one or more intermediate nodes in ascending order of frequency of occurrence are stored in one or more storage areas starting from a storage area of the tail index N−1 in a direction in which the index decreases. The one or more intermediate nodes are stored in the FIFO manner in order from the tail index N−1.

Both the storage area of the index 0 and the storage area of the index 1 are connected to the node selection unit 415 by, for example, fixed wiring. As a result, the node selection unit 415 is capable of reading a leaf node stored in the storage area of the index 0 and a leaf node stored in the storage area of the index 1.

Both the storage area of the index N−1 and a storage area of an index N−2 are connected to the node selection unit 415 by, for example, fixed wiring. As a result, the node selection unit 415 is capable of reading an intermediate node stored in the storage area of the index N−1 and an intermediate node stored in the storage area of the index N−2.

Each of the storage areas corresponding to an index range from the index 2 to the index N−3 that are obtained by excluding the storage areas of the indexes 0, 1, N−2, and N−1 from the N storage areas is not connected to the node selection unit 415. Therefore, a leaf node or an intermediate node stored in each of the storage areas from the index 2 to the index N−3 is not read by the node selection unit 415.

As described above, in the queue 51, the storage areas from which leaf nodes may be read by the node selection unit 415 are fixed to the storage area of the index 0 and the storage area of the index 1. In the queue 51, the storage areas from which intermediate nodes may be read by the node selection unit 415 are fixed to the storage area of the index N−1 and the storage area of the index N−2.

Each of the storage areas in the leaf/intermediate node queue part 51-2 (that is, the storage areas from the index N/2 to the index N−1) is connected to the demultiplexer 419. The demultiplexer 419 may write an intermediate node entry to each of the storage areas in the leaf/intermediate node queue part 51-2.

In an initial state, the sorted frequency table 38 is stored in the queue 51. The storage of the sorted frequency table 38 in the queue 51 in the initial state is as described above in the first embodiment. In the initial state, each of the entries stored in the queue 51 is an entry of a leaf node included in a Huffman tree. No entry of an intermediate node is stored in the queue 51 in the initial state.

The leaf node queue range 51L is specified by an index range of the array. In a case where the entries in the sorted frequency table 38 are sorted in ascending order of frequency of occurrence, an index indicative of the head of the leaf node queue range 51L indicates a storage area that stores, in the initial state, the head entry among the entries in the sorted frequency table 38 (in FIG. 14, the storage area of the index 0). In a case where the entries in the sorted frequency table 38 are sorted in descending order of frequency of occurrence, the index indicative of the head of the leaf node queue range 51L indicates a storage area that stores, in the initial state, the tail entry among the entries in the sorted frequency table 38. In a case where the entries in the sorted frequency table 38 are sorted in ascending order of frequency of occurrence, an index indicative of the tail of the leaf node queue range 51L indicates a storage area storing the tail entry among the entries in the sorted frequency table 38. In a case where the entries in the sorted frequency table 38 are sorted in descending order of frequency of occurrence, the index indicative of the tail of the leaf node queue range 51L indicates a storage area storing the head entry among the entries in the sorted frequency table 38.

The node selection unit 415 reads two leaf nodes corresponding to two indexes from the head of the leaf node queue range 51L in a direction approaching the tail of the leaf node queue range 51L. In the example illustrated in FIG. 14, the node selection unit 415 reads two leaf nodes that are stored in the two storage areas of the index 0 and the index 1, respectively. In a case where only one leaf node is stored in the queue 51 (that is, in a case where a leaf node is stored only in the storage area of the index 0), the node selection unit 415 reads the one leaf node. In a case where no leaf node is stored in the queue 51, the node selection unit 415 does not read any leaf node.

The node selection unit 415 reads two intermediate nodes corresponding to two indexes from the head of the intermediate node queue range 51B in a direction approaching the tail of the intermediate node queue range 51B. An index indicative of the head of the intermediate node queue range 51B is equal to the index indicative of the tail of the leaf node queue range 51L in the initial state. An index indicative of the tail of the intermediate node queue range 51B is, in the initial state, the same as the head of the intermediate node queue range 51B. The intermediate node queue range 51B at least includes one or more storage areas that correspond to an index range from the head of the intermediate node queue range 51B to the intermediate node write pointer WrPtrB. In the example illustrated in FIG. 14, the node selection unit 415 reads two intermediate nodes that are stored in the two storage areas of the index N−1 and the index N−2, respectively. In a case where only one intermediate node is stored in the queue 51 (that is, in a case where an intermediate node is stored only in the storage area of the index N−1), the node selection unit 415 reads the one intermediate node. In a case where no intermediate node is stored in the queue 51, the node selection unit 415 does not read any intermediate node.

Then, the node selection unit 415 selects two nodes having smaller frequencies of occurrence from at most two read leaf nodes and at most two read intermediate nodes. The node selection unit 415 notifies the shift controllers 420 of the number L of leaf nodes among the two selected nodes. The node selection unit 415 notifies the shift controllers 420 and the intermediate node WrPtr control unit 418 of the number M of intermediate nodes among the two selected nodes. The node selection unit 415 sends the two selected nodes to the intermediate node generation unit 416.

Operations of the intermediate node generation unit 416 and the Huffman tree information generation unit 417 are similar to the operations of the intermediate node generation unit 416 and the Huffman tree information generation unit 417 in the code table generation device 32 according to the first embodiment described above with reference to FIG. 11.

Each of the shift controllers 420 is connected to multiple storage areas (in FIG. 14, three or four storage areas). Each of the shift controllers 420 controls an operation of shifting (moving) a node (entry) stored in a connected storage area to another connected storage area. Each shift controller 420 controls a node to be shifted and an amount of shifting the node, based on the notification from the node selection unit 415. Specifically, the shift controllers 420 shifts all leaf nodes in the leaf node queue range 51L by indexes that correspond to the number L of leaf nodes among the two selected nodes, which has been received from the node selection unit 415, in a direction in which a leaf node having a smaller frequency of occurrence is stored. That is, an index of a storage area in which a leaf node is stored after the shift becomes a value obtained by subtracting the number L of leaf nodes among the two selected nodes from the index of the storage area in which the leaf node was stored before the shift. Further, the shift controllers 420 shifts all intermediate nodes in the intermediate node queue range 51B by indexes that correspond to the number M of intermediate nodes among the two selected nodes, which has been received from the node selection unit 415, in a direction in which an intermediate node having a smaller frequency of occurrence is stored. That is, an index of a storage area in which an intermediate node is stored after the shift becomes a value obtained by adding the number M of intermediate nodes among the two selected nodes to the index of the storage area in which the intermediate node was stored before the shift.

The shift controllers 420 include, for example, shift controllers 420-1, 420-2, 420-3, 420-4, 420-5, and 420-6. The shift controllers 420-1, 420-2, and 420-3 are connected to storage areas in the leaf/intermediate node queue part 51-2. The shift controller 420-4 is connected to both storage areas in the leaf/intermediate node queue part 51-2 and a storage area in the leaf node queue part 51-1. The shift controllers 420-5 and 420-6 are connected to storage areas in the leaf node queue part 51-1. One of the shift controllers 420 that is not specified may be referred to as a shift controller 420.

Hereinafter, an operation of the shift controllers 420-1, 420-2, and 420-3, an operation of the shift controller 420-4, and an operation of the shift controllers 420-5 and 420-6 will be sequentially described.

First, the operation of the shift controllers 420-1, 420-2, and 420-3 will be described.

Each of the shift controllers 420-1, 420-2, and 420-3 is configured to shift a leaf node entry stored in the connected storage area by one index or two indexes in a direction in which a leaf node entry including a smaller frequency of occurrence is stored, based on the number L of leaf nodes among the two selected nodes received from the node selection unit 415. Each of the shift controllers 420-1, 420-2, and 420-3 is configured to shift an intermediate node entry stored in the connected storage area by one index or two indexes in a direction in which an intermediate node entry including a smaller frequency of occurrence is stored, based on the number M of intermediate nodes among the two selected nodes received from the node selection unit 415.

For example, the shift controller 420-2 is connected to four storage areas of indexes N−1, N−2, N−3, and N−4.

In a case where the received number L of leaf nodes among the two selected nodes is one and a leaf node entry is stored in the storage area of the index N−2, the shift controller 420-2 shifts the leaf node entry by one index in a direction in which a leaf node entry having a smaller frequency of occurrence is stored. As a result, the entry stored in the index N−2 is moved to the storage area of the index N−3. In a case where the received number L of leaf nodes among two selected nodes is one and an intermediate node entry is stored in the storage area of the index N−2, the shift controller 420-2 does not shift the intermediate node entry.

In a case where the received number L of leaf nodes among the two selected nodes is two and a leaf node entry is stored in the storage area of the index N−1, the shift controller 420-2 shifts the leaf node entry by two indexes in a direction in which a leaf node entry including a smaller frequency of occurrence is stored. As a result, the entry stored in the index N−1 is moved to the storage area of the index N−3. In a case where the received number L of leaf nodes among the two selected nodes is two and an intermediate node entry is stored in the storage area of the index N−1, the shift controller 420-2 does not shift the intermediate node entry.

In a case where the received number M of intermediate nodes among the two selected nodes is one and an intermediate node entry is stored in the storage area of the index N−3, the shift controller 420-2 shifts the intermediate node entry by one index in a direction in which an intermediate node entry including a smaller frequency of occurrence is stored. As a result, the entry stored in the index N−3 is moved to the storage area of the index N−2. In a case where the received number M of intermediate nodes among the two selected nodes is one and a leaf node entry is stored in the storage area of the index N−3, the shift controller 420-2 does not shift the leaf node entry.

In a case where the received number M of intermediate nodes among the two selected nodes is two and an intermediate node entry is stored in the storage area of the index N−4, the shift controller 420-2 shifts the intermediate node entry by two indexes in a direction in which an intermediate node entry including a smaller frequency of occurrence is stored. As a result, the entry stored in the index N−4 is moved to the storage area of the index N−2. In a case where the received number M of intermediate nodes among the two selected nodes is two and a leaf node entry is stored in the storage area of the index N−4, the shift controller 420-2 does not shift the leaf node entry.

In a case where the received number L of leaf nodes among the two selected nodes is 0, the shift controller 420-2 shifts neither a leaf or intermediate node entry stored in the storage area of the index N−2 nor a leaf or intermediate node entry stored in the storage area of the index N−1.

In a case where the received number M of intermediate nodes among the two selected nodes is 0, the shift controller 420-2 shifts neither a leaf or intermediate node entry stored in the storage area of the index N−3 nor a leaf or intermediate node entry stored in the storage area of the index N−4.

Similarly, each of the shift controllers 420-1 and 420-3 may shift a leaf node entry stored in the connected storage area in a direction in which a leaf node entry including a smaller frequency of occurrence is stored, based on the received number L of leaf nodes among the two selected nodes. Each of the shift controllers 420-1 and 420-3 may shift an intermediate node entry stored in the connected storage area in a direction in which an intermediate node entry including a smaller frequency of occurrence is stored, based on the received number M of intermediate nodes among the two selected nodes.

Next, the operation of the shift controller 420-4 will be described.

The shift controller 420-4 is connected to three storage areas of indexes N/2+1, N/2, and N/2−1. The shift controller 420-4 is configured to shift a leaf node entry stored in the connected storage area by one index or two indexes in a direction in which a leaf node entry including a smaller frequency of occurrence is stored, based on the number L of leaf nodes among the two selected nodes received from the node selection unit 415.

In a case where the received number L of leaf nodes among the two selected nodes is one and a leaf node entry is stored in the storage area of the index N/2, the shift controller 420-4 shifts the leaf node entry by one index in a direction in which a leaf node entry including a smaller frequency of occurrence is stored. As a result, the entry stored in the index N/2 is moved to the storage area of the index N/2−1. In a case where the received number L of leaf nodes among the two selected nodes is one and an intermediate node entry is stored in the storage area of the index N/2, the shift controller 420-4 does not shift the intermediate node entry.

In a case where the received number L of leaf nodes among the two selected nodes is two and a leaf node entry is stored in the storage area of the index N/2+1, the shift controller 420-4 shifts the leaf node entry by two indexes in a direction in which a leaf node entry including a smaller frequency of occurrence is stored. As a result, the entry stored in the index N/2+1 is moved to the storage area of the index N/2−1. In a case where the received number L of leaf nodes among the two selected nodes is two and an intermediate node entry is stored in the storage area of the index N/2+1, the shift controller 420-4 does not shift the intermediate node entry.

Next, the operation of the shift controllers 420-5 and 420-6 will be described.

Each of the shift controllers 420-5 and 420-6 is configured to shift a leaf node stored in the connected storage area by one index or two indexes in a direction in which a leaf node entry including a smaller frequency of occurrence is stored, based on the number L of leaf nodes among the two selected nodes received from the node selection unit 415.

For example, the shift controller 420-6 is connected to three storage areas of the indexes 0, 1, and 2.

In a case where the received number L of leaf nodes among the two selected nodes is one and a leaf node entry is stored in the storage area of the index 1, the shift controller 420-6 shifts the leaf node entry by one index in a direction in which a leaf node entry including a smaller frequency of occurrence is stored. As a result, the entry stored in the storage area of the index 1 is moved to the storage area of the index 0. The leaf node entry that was stored in the storage area of the index 0 before the shifting by one index is deleted from the queue 51.

In a case where the received number L of leaf nodes among the two selected nodes is two and a leaf node entry is stored in the storage area of the index 2, the shift controller 420-6 shifts the leaf node entry by two indexes in a direction in which a leaf node entry including a smaller frequency of occurrence is stored. As a result, the entry stored in the storage area of the index 2 is moved to the storage area of the index 0. The leaf node entries that were stored in the respective storage areas of the indexes 0 and 1 before the shifting by two indexes are deleted from the queue 51.

In a case where the received number L of leaf nodes among the two selected nodes is 0, the shift controller 420-6 shifts neither the leaf node entry stored in the storage area of the index 1 nor the leaf node entry stored in the storage area of the index 2.

Similarly, the shift controller 420-5 may shift a leaf node entry stored in the connected storage area by the number of indexes corresponding to the received number L of leaf nodes among the two selected nodes in a direction in which a leaf node entry including a smaller frequency of occurrence is stored.

The intermediate node WrPtr control unit 418 controls the intermediate node write pointer WrPtrB. The intermediate node write pointer WrPtrB is a pointer indicative of a storage area in the queue 51 to which an intermediate node is newly written. The intermediate node write pointer WrPtrB indicates, in the initial state, an index indicative of the tail of the leaf node queue range 51L (in FIG. 14, N−1). The intermediate node WrPtr control unit 418 sends the write pointer WrPtrB to the demultiplexer 419.

The demultiplexer 419 writes an intermediate node (that is, an entry of the intermediate node) received from the intermediate node generation unit 416 to the queue 51, based on the write pointer WrPtrB received from the intermediate node WrPtr control unit 418. Specifically, the demultiplexer 419 identifies one storage area in the queue 51 by using the write pointer WrPtrB. Then, the demultiplexer 419 writes the intermediate node in the identified storage area. As a result, the newly generated intermediate node can be stored in the queue 51.

Here, an update method of the intermediate node write pointer WrPtrB will be described.

FIG. 15 illustrates an example of the initial value and the update method of the write pointer WrPtrB.

As described above, the initial value of the write pointer WrPtrB is N−1.

When the node selection unit 415 has notified the intermediate node WrPtr control unit 418 of the number M of intermediate nodes among the two selected nodes, the intermediate node WrPtr control unit 418 updates the write pointer WrPtrB by adding a value that is obtained by subtracting one from the number M of intermediate nodes among the two selected nodes to a current value of the write pointer WrPtrB. The intermediate node WrPtr control unit 418 sends the updated write pointer WrPtrB to the demultiplexer 419.

One cycle of operation by the node selection unit 415, the intermediate node generation unit 416, the Huffman tree information generation unit 417, the shift controllers 420-1, 420-2, 420-3, 420-4, 420-5, and 420-6, the demultiplexer 419, and the intermediate node WrPtr control unit 418 described above is one loop operation in the Huffman tree generation unit 323. This loop operation is repeatedly performed until the queue 51 does not store any node having no parent node. Each time the loop operation is repeated, the Huffman tree information generation unit 417 generates an item of Huffman tree information corresponding to a newly generated intermediate node. The generated Huffman tree information includes information indicating a leaf node and an intermediate node that are included in a Huffman tree. Therefore, the Huffman tree generation unit 323 can generate the Huffman tree corresponding to the sorted frequency table 38 by using all generated items of Huffman tree information. That is, generating the items of Huffman tree information until the queue 51 does not store any node having no parent node corresponds to generating the Huffman tree. Therefore, the code length determination unit 324 can acquire the Huffman tree corresponding to the sorted frequency table 38 by using all the generated items of Huffman tree information. Then, the code length determination unit 324 can determine a code length for each symbol of the input symbols, based on the acquired Huffman tree.

FIG. 16 illustrates an example of transition of nodes (entries) stored in the queue 51 and a pointer, in Huffman tree generation by the Huffman tree generation unit 323. Hereinafter, with respect to the transition of nodes stored in the queue 51 and a pointer, an initial state and a state every time the loop operation is performed in the Huffman tree generation unit 323 described above will be described in order. In part of FIG. 16, "frequency of occurrence" is abbreviated as "freq.", and "intermediate" is abbreviated as "inter."

(Initial State)

In the initial state, each of storage areas in the queue 51 corresponding to a specified index range stores each of entries in the sorted frequency table 38, in order from the head. Each of the stored entries corresponds to a leaf node included in a Huffman tree.

Here, it is assumed that six entries sorted in ascending order of frequency of occurrence are stored in order from the head of six storage areas that correspond to an index range from 0 to 5. That is, the six storage areas from the index 0 to the index 5 store the six entries sorted in ascending order of frequency of occurrence, respectively. A specific example in which the six leaf node entries are stored in the respective six storage areas in the initial state is similar to the example described above with reference to FIG. 13. In the initial state, the six storage areas from the index 0 to the index 5 are a leaf node queue range 51L.

The intermediate node write pointer WrPtrB is set to five (=6−1) as an initial value. That is, in the initial state, the intermediate node write pointer WrPtrB is set to the index 5 indicative of the tail of the leaf node queue range 51L.

(First Loop Operation)

In the first loop operation, the node selection unit 415 acquires two leaf nodes "a" and "e" from the two storage areas of the indexes 0 and 1 in the queue 51 in the initial state. Since no intermediate node is stored in the queue 51 in the initial state, the node selection unit 415 does not acquire any intermediate node. More specifically, for example, the node selection unit 415 reads two leaf nodes "c" and "d" from the two storage areas of the indexes 5 and 4 in the queue 51 in the initial state, but does not acquire the leaf nodes "c" and "d" as child node candidates for generating a new intermediate node since the leaf nodes "c" and "d" are not intermediate nodes (more specifically, in each of the entries of the leaf nodes "c" and "d", the node type is "leaf"). Then, the node selection unit 415 selects the acquired two leaf nodes "a" and "e" as two selected nodes having a smaller frequency of occurrence in the queue 51.

The intermediate node generation unit 416 generates an intermediate node "X" having the selected leaf node "a" and leaf node "e" as children. The intermediate node generation unit 416 sets four (=2+2), which is the sum of the frequencies of occurrence of the leaf node "a" and the leaf node "e", as a frequency of occurrence of the generated intermediate node "X". An entry of the intermediate node "X" includes, for example, the frequency of occurrence, identification information, and child node information of the intermediate node "X". The child node information of the intermediate node "X" includes information indicative of the leaf node "a" and the leaf node "e", which are child nodes.

Since the two leaf nodes have been selected as the two selected nodes, the shift controller 420 shifts the six leaf nodes "a", "e", "b", "f", "c", and "d" stored in the six storage areas from the index 0 to the index 5 (i.e., leaf node queue range 51L) by two indexes in a direction in which a leaf node entry including a smaller frequency of occurrence is stored. As a result, the entries of the two leaf nodes "a" and "e" (that is, entries of the two selected nodes) that were stored in the two storage areas of the index 0 and the index 1 are deleted from the queue 51. The two storage areas of the index 4 and the index 5 become free areas in which no entry is stored, and can be reallocated. Since the information indicative of the leaf node "a" and the leaf node "e" is included in the child node information of the intermediate node "X", even when the entries of the leaf node "a" and the leaf node "e" are deleted from the queue 51, the Huffman tree can be constructed.

The demultiplexer 419 can allocate, as an intermediate node queue range, the storage areas that have become free areas in response to the deletion of the entries of the leaf node "a" and the leaf node "e", and use the storage areas for storing entries of new intermediate nodes (for example, the intermediate node "X"). The demultiplexer 419 writes the entry of the intermediate node "X" to the storage area in the queue 51 indicated by the intermediate node write pointer WrPtrB (that is, the storage area of the index 5). The information included in the entry of the intermediate node "X" is output to, for example, the outside of the Huffman tree generation unit 323 as Huffman tree information.

Then, since the number M of intermediate nodes selected as the two selected nodes is 0, the intermediate node WrPtr control unit 418 adds−1 (=0−1) to the intermediate node write pointer WrPtrB. Therefore, the write pointer WrPtrB is updated with the index 4.

By the first loop operation described above, in the queue 51, the leaf node queue range 51L becomes four storage areas corresponding to an index range from the index 0 (head index) to the index 3. The intermediate node queue range 51B becomes two storage areas corresponding to an index range from the index 4 to the index 5 (tail index).

(Second Loop Operation)

In the second loop operation, the node selection unit 415 acquires the two leaf nodes "b" and "f" from the two storage areas of the index 0 and the index 1 in the queue 51 after the first loop operation. The node selection unit 415 acquires the intermediate node "X" from the two storage areas of the index 5 and the index 4 in the queue 51 after the first loop operation. That is, since the storage area of the index 4 in the queue 51 after the first loop operation is a free area, the node selection unit 415 acquires the intermediate node "X" from the storage area of the index 5. Then, from the two leaf nodes "b" (whose frequency of occurrence is two) and "f" (whose frequency of occurrence is three), and the intermediate node "X" (whose frequency of occurrence is four), the node selection unit 415 selects the leaf node "b" and the leaf node "f" as two selected nodes having smaller frequencies of occurrence.

The intermediate node generation unit 416 generates an intermediate node "Y" having the selected leaf node "b" and leaf node "f" as children. The intermediate node generation unit 416 sets five (=2+3), which is the sum of the frequencies of occurrence of the leaf node "b" and the leaf node "f", as a frequency of occurrence of the generated intermediate node "Y". An entry of the intermediate node "Y" includes, for example, the frequency of occurrence, identification information, and child node information of the intermediate node "Y". The child node information of the intermediate node "Y" includes information indicative of the leaf node "b" and the leaf node "f", which are child nodes.

Since the two leaf nodes have been selected as the two selected nodes, the shift controller 420 shifts the four leaf nodes "b", "f", "c", and "d" stored in the four storage areas from the index 0 to the index 3 by two indexes in a direction in which a leaf node entry including a smaller frequency of occurrence is stored. As a result, the entries of the two leaf nodes "b" and "f" (that is, the entries of the two selected nodes) stored in the two storage areas of the index 0 and the index 1 are deleted from the queue 51. The two storage areas of the index 2 and the index 3 become free areas in which no entry is stored, and can be reallocated. Since the information indicative of the leaf node "b" and the leaf node "f" is included in the child node information of the intermediate node "Y", even when the entries of the leaf node "b" and the leaf node "f" are deleted from the queue 51, the Huffman tree can be constructed.

The demultiplexer 419 can allocate, as the intermediate node queue range 51B, the storage areas that have become free areas in response to the deletion of the leaf node "b" and the leaf node "f", and use the storage areas for storing entries of new intermediate nodes. The demultiplexer 419 writes the entry of the intermediate node "Y" to the storage area in the queue 51 indicated by the intermediate node write pointer WrPtrB (that is, the storage area of the index 4). The information included in the entry of the intermediate node "Y" is output to, for example, the outside of the Huffman tree generation unit 323 as Huffman tree information.

Then, since the number of intermediate nodes selected as the two selected nodes is 0, the intermediate node WrPtr control unit 418 adds −1 (=0-1) to the intermediate node write pointer WrPtrB. Therefore, the write pointer WrPtrB is updated with the index 3.

By the second loop operation described above, the leaf node queue range 51L becomes two storage areas corresponding to an index range from the index 0 to the index 1. The intermediate node queue range 51B becomes four storage areas corresponding to an index range from the index 2 to the index 5.

(Third Loop Operation)

In the third loop operation, the node selection unit 415 acquires the two leaf nodes "c" and "d" from the two storage areas of the index 0 and the index 1 in the queue 51 after the second loop operation. The node selection unit 415 acquires the intermediate node "X" and the intermediate node "Y" from the two storage areas of the index 5 and the index 4 in the queue 51 after the second loop operation. Then, from the two leaf nodes "c" (whose frequency of occurrence is five) and "d" (whose frequency of occurrence is six), the intermediate node "X" (whose frequency of occurrence is four), and the intermediate node "Y" (whose frequency of occurrence is five), the node selection unit 415 selects the intermediate node "X" and the leaf node "c" as two selected nodes having smaller frequencies of occurrence.

The intermediate node generation unit 416 generates an intermediate node "Z" having the selected intermediate node "X" and the leaf node "c" as children. The intermediate node generation unit 416 sets nine (=4+5), which is the sum of the frequencies of occurrence of the intermediate node "X" and the leaf node "c", as a frequency of occurrence of the generated intermediate node "Z". An entry of the intermediate node "Z" includes, for example, the frequency of occurrence, identification information, and child node information of the intermediate node "Z". The child node information of the intermediate node "Z" includes information indicative of the intermediate node "X" and the leaf node "c", which are child nodes.

Since the one leaf node has been selected as one of the two selected nodes, the shift controller 420 shifts the two leaf nodes "c" and "d" stored in the two storage areas of the index 0 and the index 1 by one index in a direction in which a leaf node entry including a smaller frequency of occurrence is stored. As a result, the entry of the leaf node "c" (that is, the entry of the one selected node) stored in the storage area of the index 0 is deleted from the queue 51. The storage area of the index 1 becomes a free area in which no entry is stored and can be reallocated. Since the information indicative of the leaf node "c" is included as the child node information of the intermediate node "Z", even when the entry of the leaf node "c" is deleted from the queue 51, the Huffman tree can be constructed.

The demultiplexer 419 can allocate, as the intermediate node queue range 51B, the storage area that has become a free area in response to the deletion of the leaf node "c", and use the storage area for storing an entry of a new intermediate node. The demultiplexer 419 writes the entry of the intermediate node "Z" to the storage area in the queue 51 indicated by the intermediate node write pointer WrPtrB (that is, the storage area of the index 3). The information included in the entry of the intermediate node "Z" is output to, for example, the outside of the Huffman tree generation unit 323 as Huffman tree information.

Then, since the one intermediate node has been selected as one of the two selected nodes, the shift controller 420 shifts the three intermediate nodes Z, Y, and X stored in the three storage areas from the index 3 to the index 5 by one index in a direction in which an intermediate node entry including a smaller frequency of occurrence is stored. As a result, the entry of the intermediate node "X" (that is, the entry of the one selected node) stored in the storage area of the index 5 is deleted from the queue 51. The storage area of the index 3 becomes a free area in which no entry is stored. Since the information indicative of the deleted intermediate node "X" is included in the child node information of the intermediate node "Z", even when the entry of the intermediate node "X" is deleted from the queue 51, the Huffman tree can be constructed.

Then, since the number M of intermediate nodes selected as the two selected nodes is one, the intermediate node WrPtr control unit 418 adds 0 (=1-1) to the intermediate node write pointer WrPtrB. Therefore, the write pointer WrPtrB is maintained at the index 3.

By the third loop operation described above, the leaf node queue range 51L becomes one storage area of the index 0. The intermediate node queue range 51B becomes five storage areas corresponding to an index range from the index 1 to the index 5.

(Fourth Loop Operation)

In the fourth loop operation, the node selection unit 415 acquires the leaf node "d" from the two storage areas of the index 0 and the index 1 in the queue 51 after the third loop operation. That is, since the storage area of the index 1 in the queue 51 after the third loop operation is a free area, the node selection unit 415 acquires the leaf node "d" from the storage area of the index 0. The node selection unit 415 acquires the intermediate node "Y" and the intermediate node "Z" from the two storage areas of the index 5 and the index 4 in the queue 51 after the third loop operation. Then, from the leaf node "d" (whose frequency of occurrence is six), the intermediate node "Y" (whose frequency of occurrence is five), and the intermediate node "Z" (whose frequency of occurrence is nine), the node selection unit 415 selects the intermediate node "Y" and the leaf node "d" as two selected nodes having smaller frequencies of occurrence.

Next, the intermediate node generation unit 416 generates an intermediate node "W" having the intermediate node "Y" and the leaf node "d" as children. The intermediate node generation unit 416 sets 11 (=5+6), which is the sum of the frequencies of occurrence of the intermediate node "Y" and the leaf node "d", as a frequency of occurrence of the generated intermediate node "W". An entry of the intermediate node "W" includes, for example, the frequency of occurrence, identification information, and child node information of the intermediate node "W". The child node information of the intermediate node "W" includes information indicative of the intermediate node "Y" and the leaf node "d", which are child nodes.

Since the one leaf node has been selected as one of the two selected nodes, the shift controller 420 shifts the leaf node "d" stored in the storage area of the index 0 by one index in a direction in which a leaf node entry including a smaller frequency of occurrence is stored. As a result, the entry of the leaf node "d" (that is, the entry of the one selected node) stored in the storage area of the index 0 is deleted from the queue 51. The storage area of the index 0 becomes a free area in which no entry is stored and can be reallocated. Since the information indicative of the leaf node "d" is included as the child node information of the intermediate node "W", even when the entry of the leaf node "d" is deleted from the queue 51, the Huffman tree can be constructed.

The demultiplexer 419 can allocate, as the intermediate node queue range, the storage area that has become a free area in response to the deletion of the leaf node "d", and use the storage area for storing an entry of a new intermediate node. The demultiplexer 419 writes the entry of the intermediate node "W" to the storage area in the queue 51 indicated by the intermediate node write pointer WrPtrB (that is, the storage area of the index 3). The information included in the entry of the intermediate node "W" is output to, for example, the outside of the Huffman tree generation unit 323 as Huffman tree information.

Then, since the one intermediate node has been selected as one of the two selected nodes, the shift controller 420 shifts the three intermediate nodes "W", "Z", and "Y" stored in the three storage areas from the index 3 to the index 5 by one index in a direction in which an intermediate node entry including a smaller frequency of occurrence is stored. As a result, the entry of the intermediate node "Y" (that is, the entry of the one selected node) stored in the storage area of the index 5 is deleted from the queue 51. The storage area of the index 3 becomes a free area in which no entry is stored. Since the information indicative of the deleted intermediate node "Y" is included in the child node information of the intermediate node "W", even when the entry of the intermediate node "Y" is deleted from the queue 51, the Huffman tree can be constructed.

Then, since the number M of intermediate nodes selected as the two selected nodes is one, the intermediate node WrPtr control unit 418 adds 0 (=1-1) to the intermediate node write pointer WrPtrB. Therefore, the write pointer WrPtrB is maintained at the index 3.

By the fourth loop operation described above, the queue 51 has no leaf node queue range 51L. The intermediate node queue range 51B becomes six storage areas corresponding to an index range from the index 0 to the index 5.

Furthermore, after the fourth loop operation, the number of nodes having no parent node stored in the queue 51 becomes two. For the two nodes having no parent node (here, the intermediate node "Z" and the intermediate node "W"), the root node of the Huffman tree is set as a parent node. Therefore, the generation of the Huffman tree in the Huffman tree generation unit 323 is completed.

As described above, in the Huffman tree generation unit 323 according to the present embodiment, the storage areas in the one queue 51 can be shared for storage of leaf nodes and storage of intermediate nodes. Specifically, the Huffman tree generation unit 323 uses a storage area in the queue 51 that has become a free area in response to generation of a new intermediate node, for storage of an intermediate node. As a result, as compared with a case where the leaf node queue 51A-1 and the intermediate node queue 51A-2 are separately provided as in the Huffman tree generation unit 323A of the comparative example, the size of the storage areas provided for storing leaf nodes and intermediate nodes can be reduced, and the circuit scale required for constructing the Huffman tree can be reduced.

In the Huffman tree generation unit 323 according to the first embodiment, based on the two read pointers RdPtrL and RdPtrB, the two multiplexers 412 and 414 acquire child node candidates (that is, two leaf nodes and two intermediate nodes) for generating a new intermediate node, and send the child node candidates to the node selection unit 415.

On the other hand, in the Huffman tree generation unit 323 according to the second embodiment, the shift controllers 420 shift leaf node entries and intermediate node entries in the queue 51, so that child node candidates for generating a new intermediate node are fixedly arranged in the two storage areas corresponding to the index 0 indicating the head of the leaf node queue range 51L and the next index 1, and in the two storage areas corresponding to the index N−1 indicating the head of the intermediate node queue range 51B and the next index N−2. Therefore, the Huffman tree generation unit 323 of the second embodiment does not need to be provided with the read pointers RdPtrL and RdPtrB that manage locations of the child node candidates and the multiplexers 412 and 414 that acquire the child node candidates based on the read pointers RdPtrL and RdPtrB. That is, the node selection unit 415 can acquire the child node candidates from the four storage areas corresponding to the index 0, the index 1, the index N−1, and the index N−2 throughout. Therefore, in the Huffman tree generation unit 323 of the second embodiment, since a logic delay due to the multiplexers 412 and 414 does not occur as compared with the Huffman tree generation unit 323 of the first embodiment, an operation frequency in units of the loop operation described above can be improved.

Third Embodiment

In the code table generation device 32 according to the first and second embodiments, one intermediate node is generated in one loop operation. On the other hand, in a code table generation device 32 according to a third embodiment, two or more intermediate nodes are generated in one loop operation.

A configuration of a memory system 3 that includes the code table generation device 32 of the third embodiment is similar to that of the memory systems 3 that include the code table generation devices 32 of the first and second embodiments. The code table generation device 32 of the third embodiment is different from the code table generation devices 32 of the first and second embodiments in terms of a configuration of the Huffman tree generation unit 323.

Hereinafter, the difference from the code table generation devices 32 of the first and second embodiments will be mainly described below.

Figure 17:
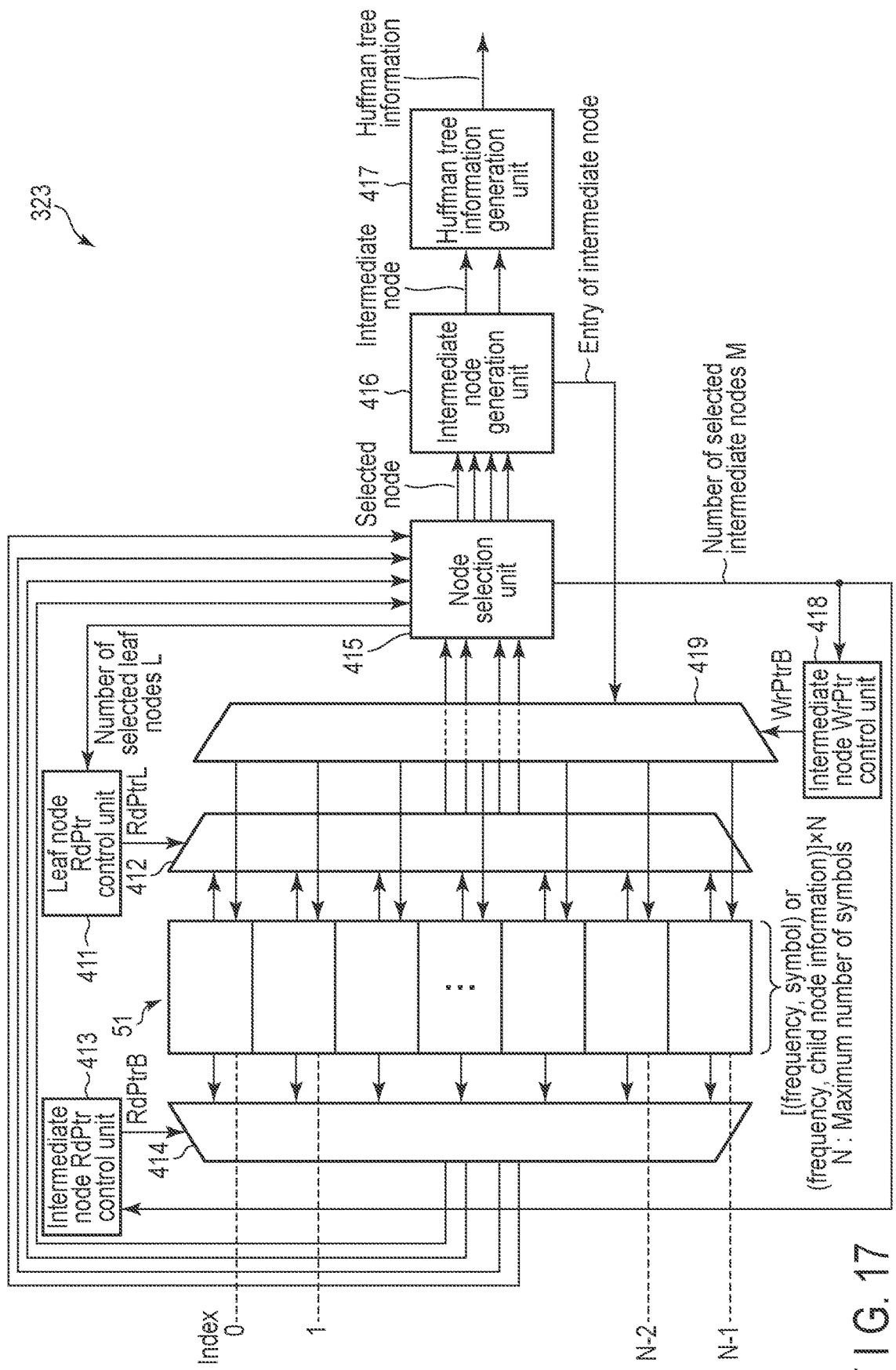
FIG. 17 is a block diagram illustrating an example of a configuration of a Huffman tree generation unit in a code table generation device according to a third embodiment.

FIG. 17 is a block diagram illustrating an example of a configuration of the Huffman tree generation unit 323 included in the code table generation device 32. A case where the Huffman tree generation unit 323 of the third embodiment includes a queue 51, a leaf node RdPtr control unit 411, a multiplexer 412, an intermediate node RdPtr control unit 413, a multiplexer 414, a node selection unit 415, an intermediate node generation unit 416, a Huffman tree information generation unit 417, an intermediate node WrPtr control unit 418, and a demultiplexer 419 similarly to the Huffman tree generation unit 323 of the first embodiment will be described below. Note that similarly to the code table generation device 32 of the second embodiment, the code table generation device 32 of the third embodiment may include the shift controllers 420, and the leaf node RdPtr control unit 411, the multiplexer 412, the intermediate node RdPtr control unit 413, and the multiplexer 414 may be unnecessary.

The queue 51, the leaf node RdPtr control unit 411, the intermediate node RdPtr control unit 413, and the intermediate node WrPtr control unit 418 are as described above with reference to FIG. 11 in the first embodiment. The initial values of the leaf node read pointer RdPtrL, the intermediate node read pointer RdPtrB, and the intermediate node write pointer WrPtrB are all 0.

The multiplexer 412 acquires X leaf nodes stored in the queue 51, based on the read pointer RdPtrL received from the leaf node RdPtr control unit 411. Specifically, the multiplexer 412 identifies X storage areas corresponding to X indexes from the read pointer RdPtrL in a direction approaching the tail of the leaf node queue range 51L. Then, the multiplexer 412 acquires the X leaf nodes that are stored in the identified X storage areas, respectively. The multiplexer 412 sends the acquired X leaf nodes to the node selection unit 415. X is an integer of one or more. In the example illustrated in FIG. 17, X is four. In a case where only a smaller number of leaf nodes than X is stored in the queue 51, the multiplexer 412 acquires the smaller number of leaf nodes than X and sends the leaf nodes to the node selection unit 415. In a case where no leaf node is stored in the queue 51, the multiplexer 412 does not acquire any leaf node.

The multiplexer 414 acquires Y intermediate nodes stored in the queue 51, based on the read pointer RdPtrB received from the intermediate node RdPtr control unit 413. Specifically, the multiplexer 412 identifies Y storage areas corresponding to Y indexes from the read pointer RdPtrB in a direction approaching the intermediate node write pointer WrPtrB. Then, the multiplexer 412 acquires the Y intermediate nodes that are stored in the identified Y storage areas, respectively. The multiplexer 412 sends the acquired Y intermediate nodes to the node selection unit 415. Y is an integer of one or more. In the example illustrated in FIG. 17, Y is four. In a case where only a smaller number of intermediate nodes than Y are stored in the queue 51, the multiplexer 412 acquires the smaller number of intermediate nodes than Y and sends the intermediate nodes to the node selection unit 415. In a case where no intermediate node is stored in the queue 51, the multiplexer 412 does not acquire any intermediate node.

The node selection unit 415 selects Z nodes having smaller frequencies of occurrence from at most X leaf nodes received from the multiplexer 412 and at most Y intermediate nodes received from the multiplexer 414. That is, the node selection unit 415 selects the first to Z-th nodes in a case where at most (X+Y) leaf/intermediate nodes are sorted in ascending order of frequency of occurrence. (X+Y) is larger than Z. Z is an integer of two or more and a multiple of two. In the example illustrated in FIG. 17, Z is four. The node selection unit 415 notifies the leaf node RdPtr control unit 411 of the number L of leaf nodes among the selected Z nodes. The node selection unit 415 notifies the intermediate node RdPtr control unit 413 and the intermediate node WrPtr control unit 418 of the number M of intermediate nodes among the Z selected nodes. The node selection unit 415 sends the Z selected nodes to the intermediate node generation unit 416.

The intermediate node generation unit 416 generates Z/2 intermediate nodes each having two of the Z selected nodes, which have been received from the node selection unit 415, as children. The intermediate node generation unit 416 sets the sum of the frequencies of occurrence of the two selected nodes that are children, as a frequency of occurrence of each of the generated Z/2 intermediate nodes. The intermediate node generation unit 416 sends the generated Z/2 intermediate nodes to the Huffman tree information generation unit 417 and the demultiplexer 419.

As an example, a case where Z is four will be specifically described. The intermediate node generation unit 416 generates, for example, a first intermediate node having, as children, the first selected node and the second selected node among the Z selected nodes arranged in ascending order of frequency of occurrence. The intermediate node generation unit 416 sets the sum of the frequencies of occurrence of the first selected node and the second selected node, as a frequency of occurrence of the first intermediate node. The intermediate node generation unit 416 generates a second intermediate node having, as children, the third selected node and the fourth selected node among the Z selected nodes arranged in ascending order of the frequency of occurrence. The intermediate node generation unit 416 sets the sum of the frequencies of occurrence of the third selected node and the fourth selected node, as a frequency of occurrence of the second intermediate node. The intermediate node generation unit 416 sends the generated first intermediate node and second intermediate node to the Huffman tree information generation unit 417 and the demultiplexer 419.

The Huffman tree information generation unit 417 generates Huffman tree information corresponding to each of the Z/2 intermediate nodes received from the intermediate node generation unit 416. The Huffman tree information generation unit 417 sends the generated Huffman tree information to the outside of the Huffman tree generation unit 323 (for example, the code length determination unit 324).

The demultiplexer 419 writes the Z/2 intermediate nodes, which have been received from the intermediate node generation unit 416, to the queue 51 on the basis of the intermediate node write pointer WrPtrB received from the intermediate node WrPtr control unit 418. Specifically, the demultiplexer 419 identifies Z/2 storage areas corresponding to Z/2 indexes from the write pointer WrPtrB in a direction approaching the leaf node read pointer RdPtrL. Then, the demultiplexer 419 sequentially writes the Z/2 intermediate nodes arranged in ascending order of frequency of occurrence, to the identified Z/2 storage areas in order in which the index increases. As a result, the newly generated Z/2 intermediate nodes can be stored in the queue 51.

When the node selection unit 415 has notified the leaf node RdPtr control unit 411 of the number L of leaf nodes among the Z selected nodes, the leaf node RdPtr control unit 411 updates the read pointer RdPtrL by adding the number L of leaf nodes among the Z selected nodes to a current value of the read pointer RdPtrL. The leaf node RdPtr control unit 411 sends the updated read pointer RdPtrL to the multiplexer 412.

When the node selection unit 415 has notified the intermediate node RdPtr control unit 413 of the number M of intermediate nodes among the Z selected nodes, the intermediate node RdPtr control unit 413 updates the read pointer RdPtrB by adding the number M of intermediate nodes among the Z selected nodes to a current value of the read pointer RdPtrB. The intermediate node RdPtr control unit 413 sends the updated read pointer RdPtrB to the multiplexer 414.

When the node selection unit 415 has notified the intermediate node WrPtr control unit 418 of the number M of intermediate nodes among the Z selected nodes, the intermediate node WrPtr control unit 418 updates the write pointer WrPtrB by adding Z/2 to a current value of the write pointer WrPtrB. The intermediate node WrPtr control unit 418 sends the updated write pointer WrPtrB to the demultiplexer 419.

One cycle of operation by the leaf node RdPtr control unit 411, the multiplexer 412, the intermediate node RdPtr control unit 413, the multiplexer 414, the node selection unit 415, the intermediate node generation unit 416, the Huffman tree information generation unit 417, the intermediate node WrPtr control unit 418, and the demultiplexer 419 is one loop operation in the Huffman tree generation unit 323. This loop operation is repeatedly performed until the queue 51 does not store any node having no parent node. Every time the loop operation is repeated, the Huffman tree generation unit 323 newly generates Z/2 intermediate nodes. Therefore, in the Huffman tree generation unit 323 of the third embodiment, the number of loop operations repeated until the generation of the Huffman tree is completed can be reduced as compared with the Huffman tree generation units 323 of the first and second embodiments that generate one intermediate node in one loop operation. Therefore, in the Huffman tree generation unit 323 of the third embodiment, a processing time required to generate the Huffman tree may be shortened.

Next, processes executed in the compression device 15 will be described with reference to flowcharts of FIGS. 18 and 20.

FIG. 18 is a flowchart illustrating an example of the procedure of an encoding process executed in the compression device 15. The encoding process is a process of converting each of symbols included in data (input data) input to the compression device 15 into a variable length code and acquiring compressed data. The encoding process is executed, for example, when data of the specific unit has been input to the compression device 15. The compression device 15 that executes the encoding process includes any of the code table generation devices 32 of the first to third embodiments.

First, the buffer unit 31 stores symbols included in the input data (step S101).

The frequency counting unit 321 of the code table generation unit 32 generates a frequency table 37 by using the symbols included in the input data (step S102). The frequency sorting unit 322 sorts N entries included in the frequency table 37 in ascending order of frequency of occurrence, thereby acquiring a sorted frequency table 38 (step S103). For example, step S101, step S102, and step S103 may be performed in parallel.

The Huffman tree generation unit 323 performs a Huffman tree generation process by using the sorted frequency table 38 (step S104). The Huffman tree generation process is a process of generating Huffman tree information based on the frequency of occurrence for each symbol of the symbols included in the input data. An example of the specific procedure of the Huffman tree generation process will be described later with reference to the flowcharts of FIGS. 19 and 20.

The code length determination unit 324 determines a code length for each symbol of the symbols by using the generated Huffman tree information (step S105). The determined code length for each symbol is sent to the canonical Huffman unit 325 and the code table compression unit 34.

The canonical Huffman unit 325 determines a variable length code assigned to each symbol by using the code length for each symbol, thereby generating a code table (step S106). The method of determining a variable length code assigned to a symbol based on a code length is as described above with reference to FIG. 12.

Next, the variable length encoding unit 33 converts each of the symbols stored in the buffer unit 31 into a variable length code by using the generated code table (step S107). The code table compression unit 34 compresses the code table (step S108). Specifically, the code table compression unit 34 performs a compression process on the code lengths that are associated with the symbols, respectively. The compression process on the code lengths is, for example, a process of rearranging the code lengths in a specific symbol order, performing run-length encoding on the rearranged code lengths, and further performing Huffman coding on the result of run-length encoding. Step S107 and step S108 may be performed in parallel.

The packing unit 35 outputs compressed data that includes the compressed code table and the concatenated variable length codes (step S109), and ends the encoding process.

As described above, the compression device 15 can convert each of the symbols included in the input data into the variable length code, and acquire the compressed data. In a case where the input data is, for example, data requested to be written to the NAND flash memory 5 by the host 2, the CPU 12 can write the compressed data obtained by compressing the input data into the NAND flash memory 5 via the NAND I/F 13.

Figure 19:
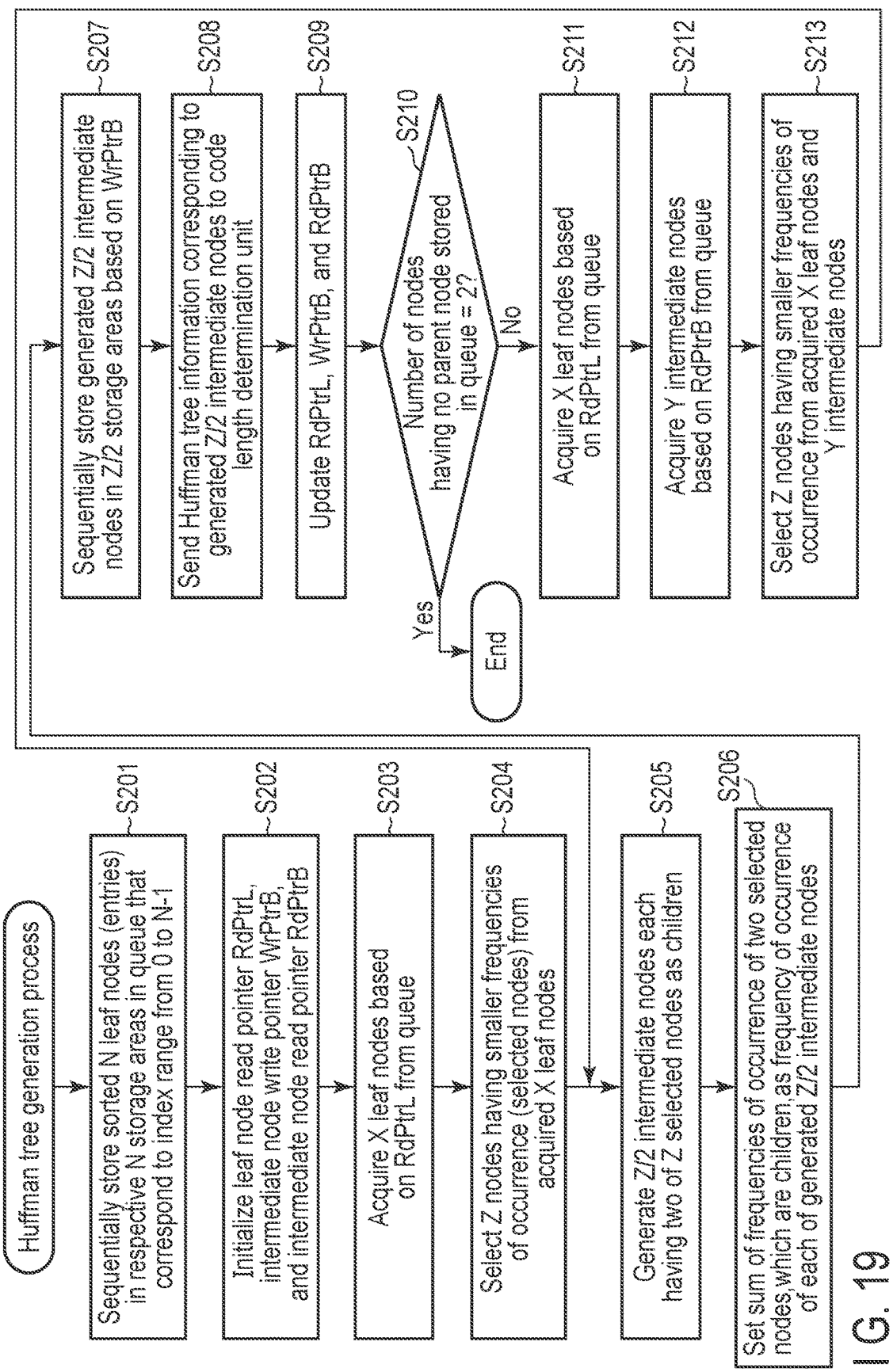
FIG. 19 is a flowchart illustrating an example of the procedure of a Huffman tree generation process executed in the code table generation device according to the third embodiment.

FIG. 19 is a flowchart illustrating an example of the procedure of the Huffman tree generation process executed by the Huffman tree generation unit 323 of the code table generation unit 32. The Huffman tree generation process is a process of generating a Huffman tree by using the sorted frequency table 38. The Huffman tree generation processing corresponds to step S104 of the encoding process described above with reference to FIG. 18.

First, the Huffman tree generation unit 323 sequentially stores N leaf nodes (that is, entries of the N leaf nodes) that are arranged in ascending order and are included in the sorted frequency table 38, in N storage areas in the queue 51 that correspond to an index range from 0 to N−1 (step S201). Then, the Huffman tree generation unit 323 initializes a leaf node read pointer RdPtrL, an intermediate node write pointer WrPtrB, and an intermediate node read pointer RdPtrB (step S202). Specifically, the Huffman tree generation unit 323 sets each of the leaf node read pointer RdPtrL, the intermediate node write pointer WrPtrB, and the intermediate node read pointer RdPtrB to 0.

Next, the Huffman tree generation unit 323 acquires X leaf nodes based on the leaf node read pointer RdPtrL from the queue 51 (step S203). Specifically, the Huffman tree generation unit 323 identifies X storage areas corresponding to X indexes starting from the read pointer RdPtrL (that is, X storage areas from the head of the leaf node queue range 51L in a direction approaching the tail of the leaf node queue range 51L). Then, the Huffman tree generation unit 323 acquires the X leaf nodes stored in the identified X storage areas. The Huffman tree generation unit 323 selects Z nodes having smaller frequencies of occurrence from the acquired X leaf nodes (step S204).

The Huffman tree generation unit 323 generates Z/2 intermediate nodes each having two of the Z selected nodes as children (step S205). The Huffman tree generation unit 323 sets the sum of the frequencies of occurrence of the two selected nodes that are children, as a frequency of occurrence of each of the generated Z/2 intermediate nodes (step S206). The Huffman tree generation unit 323 stores the generated Z/2 intermediate nodes in Z/2 storage areas based on the intermediate node write pointer WrPtrB (step S207). Specifically, the Huffman tree generation unit 323 identifies the Z/2 storage areas corresponding to Z/2 indexes from the intermediate node write pointer WrPtrB in a direction approaching the leaf node read pointer RdPtrL. Then, the Huffman tree generation unit 323 stores the generated Z/2 intermediate nodes in the identified Z/2 storage areas. The Huffman tree generation unit 323 sends Huffman tree information corresponding to the generated Z/2 intermediate nodes to the code length determination unit 324 (step S208).

The Huffman tree generation unit 323 updates the leaf node read pointer RdPtrL, the intermediate node read pointer RdPtrB, and the intermediate node write pointer WrPtrB (step S209). Specifically, the Huffman tree generation unit 323 adds the number L of leaf nodes among the Z selected nodes to the leaf node read pointer RdPtrL. The Huffman tree generation unit 323 adds the number M of intermediate nodes among the Z selected nodes to the intermediate node read pointer RdPtrB. The Huffman tree generation unit 323 adds Z/2 to the intermediate node write pointer WrPtrB.

Then, the Huffman tree generation unit 323 determines whether a total number of nodes having no parent node stored in the queue 51 is two (step S210).

In a case where the total number of nodes having no parent node stored in the queue 51 is more than two (No in step S210), the Huffman tree generation unit 323 acquires X leaf nodes based on the leaf node read pointer RdPtrL from the queue 51 (step S211). The Huffman tree generation unit 323 acquires Y intermediate nodes based on the intermediate node read pointer RdPtrB from the queue 51 (step S212).

Specifically, the Huffman tree generation unit 323 identifies Y storage areas corresponding to Y indexes starting from the intermediate node read pointer RdPtrB (that is, Y storage areas from the head of the intermediate node queue range 51B in a direction approaching the tail of the intermediate node queue range 51B). Then, the Huffman tree generation unit 323 acquires the Y intermediate nodes stored in the identified Y storage areas. The Huffman tree generation unit 323 selects Z nodes having smaller frequencies of occurrence from the acquired X leaf nodes and Y intermediate nodes (step S213), and returns to step S205. That is, the Huffman tree generation unit 323 performs processing of generating and storing Z/2 intermediate nodes by using the new Z selected nodes, generating Huffman tree information corresponding to the Z/2 intermediate nodes, and updating the pointers RdPtrL, RdPtrB, and WrPtrB. Therefore, every time the procedure from step S211 to step S213 and the procedure from step S205 to step S210 are performed, the Huffman tree generation unit 323 can generate Z/2 intermediate nodes included in the Huffman tree and Huffman tree information corresponding to the Z/2 intermediate nodes.

In a case where the total number of nodes having no parent node stored in the queue 51 is two (Yes in step S210), the Huffman tree generation unit 323 ends the Huffman tree generation process. That is, since the root node of the Huffman tree is set as the parent node for the two nodes having no parent node stored in the queue 51, the generation of the Huffman tree is completed.

By the above-described Huffman tree generation process, the Huffman tree generation unit 323 can generate the Huffman tree corresponding to the sorted frequency table 38 by using the queue 51 shared for storage of leaf nodes and storage of intermediate nodes. More specifically, the Huffman tree generation unit 323 can send the Huffman tree information representing the generated Huffman tree to the code length determination unit 324.

Note that the Huffman tree generation process in FIG. 19 in which X, Y, and Z are all two corresponds to the Huffman tree generation process in the Huffman tree generation unit 323 according to the first embodiment.

FIG. 20 is a flowchart illustrating another example of the procedure of the Huffman tree generation process executed by the Huffman tree generation unit 323 of the code table generation unit 32. The Huffman tree generation process corresponds to step S104 of the encoding process described above with reference to FIG. 18.

First, the Huffman tree generation unit 323 sequentially stores N leaf nodes (that is, entries of the N leaf nodes) that are arranged in ascending order and are included in the sorted frequency table 38, in N storage areas in the queue 51 that correspond to an index range from 0 to N−1 (step S301). Then, the Huffman tree generation unit 323 initializes an intermediate node write pointer WrPtrB (step S302). Specifically, the Huffman tree generation unit 323 sets the intermediate node write pointer WrPtrB to N−1.

Next, the Huffman tree generation unit 323 acquires X leaf nodes corresponding to X indexes from the head of the leaf node queue range 51L in a direction approaching the tail of the leaf node queue range 51L (step S303). The Huffman tree generation unit 323 selects Z nodes having smaller frequencies of occurrence from the selected X leaf nodes (step S304).

The Huffman tree generation unit 323 generates Z/2 intermediate nodes each having two of the Z selected nodes as children (step S305). The Huffman tree generation unit 323 sets the sum of the frequencies of occurrence of the two selected nodes that are children, as a frequency of occurrence of each of the generated Z/2 intermediate nodes (step S306). Based on the number L of leaf nodes among the Z selected nodes, the Huffman tree generation unit 323 shifts all entries stored in the leaf node queue range 51L by L indexes in a direction in which a leaf node entry including a smaller frequency of occurrence is stored (step S307). The Huffman tree generation unit 323 stores the generated Z/2 intermediate nodes in Z/2 storage areas based on the intermediate node write pointer WrPtrB (step S308). Specifically, the Huffman tree generation unit 323 identifies the Z/2 storage areas corresponding to Z/2 indexes from the intermediate node write pointer WrPtrB in a direction approaching the tail of the leaf node queue range 51L. Then, the Huffman tree generation unit 323 stores the generated Z/2 intermediate nodes in the identified Z/2 storage areas. The Huffman tree generation unit 323 sends Huffman tree information corresponding to the generated Z/2 intermediate nodes to the code length determination unit 324 (step S309). Then, based on the number M of intermediate nodes among the Z selected nodes, the Huffman tree generation unit 323 shifts all entries stored in the intermediate node queue range 51B by M indexes in a direction in which an intermediate node entry including a smaller frequency of occurrence is stored (step S310).

Next, the Huffman tree generation unit 323 updates the intermediate node write pointer WrPtrB (step S311). Specifically, the Huffman tree generation unit 323 adds a number that is obtained by subtracting Z/2 from the number M of intermediate nodes among the Z selected nodes, to the intermediate node write pointer WrPtrB.

Then, the Huffman tree generation unit 323 determines whether a total number of nodes having no parent node stored in the queue 51 is two (step S312).

In a case where the total number of nodes having no parent node stored in the queue 51 is more than two (No in step S312), the Huffman tree generation unit 323 acquires X leaf nodes corresponding to X indexes from the head of the leaf node queue range 51L in a direction approaching the tail of the leaf node queue range 51L (step S313). The Huffman tree generation unit 323 acquires Y intermediate nodes corresponding to Y indexes from the head of the intermediate node queue range 51B in a direction approaching the tail of the intermediate node queue range 51B (step S314). In a case where one or more leaf nodes less than X leaf nodes are stored in the queue 51 in step S313, the Huffman tree generation unit 323 acquires the one or more leaf nodes. In a case where no leaf node is stored in the queue 51, the Huffman tree generation unit 323 does not acquire any leaf node. In a case where one or more intermediate nodes less than Y intermediate nodes are stored in the queue 51 in step S314, the Huffman tree generation unit 323 acquires the one or more intermediate nodes. In a case where no intermediate node is stored in the queue 51, the Huffman tree generation unit 323 does not acquire any intermediate node.

Then, the Huffman tree generation unit 323 selects Z nodes having smaller frequencies of occurrence from the acquired (X+Y) leaf/intermediate nodes (alternatively, three to less than (X+Y) leaf/intermediate nodes) (step S315), and returns to step S305. That is, the Huffman tree generation unit 323 performs processing of generating and storing Z/2 intermediate nodes by using the new Z selected nodes, generating Huffman tree information corresponding to the Z/2 intermediate nodes, and updating the write pointer WrPtrB. Therefore, every time the procedure from step S313 to step S315 and the procedure from step S305 to step S312 are performed, the Huffman tree generation unit 323 can generate Z/2 intermediate nodes included in the Huffman tree and the Huffman tree information corresponding to the Z/2 intermediate nodes.

In a case where the total number of nodes having no parent node stored in the queue 51 is two (Yes in step S312), the Huffman tree generation unit 323 ends the Huffman tree generation process. That is, since the root node of the Huffman tree is set as the parent node for the two nodes having no parent node stored in the queue 51, the generation of the Huffman tree is completed.

By the above-described Huffman tree generation process, the Huffman tree generation unit 323 can generate the Huffman tree corresponding to the sorted frequency table 38 by using the queue 51 shared for storage of leaf nodes and storage of intermediate nodes. More specifically, the Huffman tree generation unit 323 can send the generated Huffman tree information representing the Huffman tree to the code length determination unit 324.

In the Huffman tree generation process illustrated in FIG. 20, in a case where a leaf node is selected as a child node of a newly generated intermediate node, all leaf node entries stored in the leaf node queue range 51L are shifted in a direction in which a leaf node entry including a smaller frequency of occurrence is stored. In a case where an intermediate node is selected as a child node of the newly generated intermediate node, all intermediate node entries stored in the intermediate node queue range 51B are shifted in a direction in which an intermediate node entry including a smaller frequency of occurrence is stored. By these operations, child node candidates for generating a new intermediate node are arranged in X storage areas from the head of the leaf node queue range 51L and Y storage areas from the head of the intermediate node queue range 51B. Therefore, for example, it is not necessary to provide the read pointers RdPtrL and RdPtrB that manage locations of the child node candidates, and the logic delay by the multiplexers 412 and 414 that acquire the child node candidates based on the read pointers RdPtrL and RdPtrB does not occur. Accordingly, the operation frequency can be improved.

The Huffman tree generation process in FIG. 20 in which X, Y, and Z are all two corresponds to the Huffman tree generation process in the Huffman tree generation unit 323 according to the second embodiment.

As described above, according to the code table generation devices of the first to third embodiments, the circuit scale for generating a code table can be reduced. The frequency counting unit 321 generates a frequency table 37 based on a frequency of occurrence for each symbol of input symbols. The frequency table 37 includes entries each including a symbol and a frequency of occurrence. The frequency sorting unit 322 sorts the entries in the frequency table 37 by frequency of occurrence. The Huffman tree generation unit 323 generates a Huffman tree having leaf nodes by using a queue 51 that includes storage areas in which the sorted entries are respectively stored as the leaf nodes in an initial state, in response to the entries having been sorted. The code length determination unit 324 determines a code length for each symbol of the symbols, based on the Huffman tree. The canonical Huffman unit 325 determines a code for each symbol of the symbols, based on the code length for each symbol. Each of the storage areas is capable of being allocated as either a leaf node queue range 51L that stores a leaf node or an intermediate node queue range 51B that stores an intermediate node. One or more storage areas allocated as the leaf node queue range 51L are capable of storing one or more leaf nodes, respectively, in order from the head of the leaf node queue range 51. The one of more leaf nodes are arranged in ascending order of frequency of occurrence. One or more storage areas allocated as the intermediate node queue range 51B are capable of storing one or more intermediate nodes, respectively, in order from the head of the intermediate node queue range 51B. The one or more intermediate nodes are arranged in ascending order of frequency of occurrence. The Huffman tree generation unit 323 selects Z nodes having smaller frequencies of occurrence from X leaf nodes and Y intermediate nodes. The X leaf nodes are stored in X storage areas from the head of the leaf node queue range 51L. The Y intermediate nodes are stored in Y storage areas from the head of the intermediate node queue range 51B. The Huffman tree generation unit 323 generates Z/2 intermediate nodes each having two nodes of the Z nodes as children. The Huffman tree generation unit 323 allocates, as the intermediate node queue range 51B, at least one storage area in the leaf node queue range 51L that has become capable of being reallocated in response to at least one of the X leaf nodes having been selected as the Z nodes. The Huffman tree generation unit 323 stores the Z/2 intermediate nodes in the intermediate node queue range 51B in the FIFO manner. Each of the stored Z/2 intermediate nodes indicates child node information related to the two nodes that are had as children and the sum of the frequencies of occurrence of the respective two nodes that are had as children. X is an integer of one or more. Y is an integer of one or more. The sum of X and Y is larger than Z. Z is an integer of two or more and a multiple of two.

As described above, in the code table generation device 32, the storage areas in the one queue 51 can be shared for storing leaf nodes and intermediate nodes. As a result, as compared with a case where the leaf node queue 51A-1 and the intermediate node queue 51A-2 are separately provided as in the Huffman tree generation unit 323A of the comparative example, the size of the storage areas provided for storing leaf nodes and intermediate nodes can be reduced, and the circuit scale required for constructing the Huffman tree can be reduced.

Each of the various functions described in the first to third embodiments may be realized by a circuit (e.g., processing circuit). An exemplary processing circuit may be a programmed processor such as a central processing unit (CPU). The processor executes computer programs (instructions) stored in a memory thereby performs the described functions. The processor may be a microprocessor including an electric circuit. An exemplary processing circuit may be a digital signal processor (DSP), an application specific integrated circuit (ASIC), a microcontroller, a controller, or other electric circuit components. The components other than the CPU described according to these embodiments may be realized in a processing circuit.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A code table generation device comprising:
a frequency table generation unit configured to generate a frequency table based on a frequency of occurrence for each symbol of input symbols, the frequency table including entries each including a symbol and a frequency of occurrence;
a frequency sorting unit configured to sort the entries in the frequency table by frequency of occurrence;
a Huffman tree generation unit configured to generate a Huffman tree having leaf nodes by using a queue that includes storage areas in which the sorted entries are respectively stored as the leaf nodes in an initial state, in response to the entries having been sorted;
a code length determination unit configured to determine a code length for each symbol of the symbols, based on the Huffman tree; and
a code determination unit configured to determine a code for each symbol of the symbols, based on the code length for each symbol, wherein
each of the storage areas is capable of being allocated as either a leaf node queue range that stores a leaf node or an intermediate node queue range that stores an intermediate node, one or more storage areas allocated as the leaf node queue range are capable of storing one or more leaf nodes, respectively, in order from a head of the leaf node queue range, the one or more leaf nodes being arranged in ascending order of frequency of occurrence, one or more storage areas allocated as the intermediate node queue range are capable of storing one or more intermediate nodes, respectively, in order from a head of the intermediate node queue range, the one or more intermediate nodes being arranged in ascending order of frequency of occurrence, the Huffman tree generation unit is configured to:
  select Z nodes having smaller frequencies of occurrence from X leaf nodes and Y intermediate nodes, the X leaf nodes being stored in X storage areas from the head of the leaf node queue range, the Y intermediate nodes being stored in Y storage areas from the head of the intermediate node queue range;
  generate Z/2 intermediate nodes each having two nodes of the Z nodes as children;
  allocate, as the intermediate node queue range, at least one storage area in the leaf node queue range that has become capable of being reallocated in response to at least one of the X leaf nodes having been selected as the Z nodes; and
  store the Z/2 intermediate nodes in the intermediate node queue range in a first-in first-out manner, each of the stored Z/2 intermediate nodes indicates child node information related to the two nodes that are had as children and a sum of frequencies of occurrence of the respective two nodes that are had as children, X is an integer of one or more,
Y is an integer of one or more,
a sum of X and Y is larger than Z, and
Z is an integer of two or more and a multiple of two.

2. The code table generation device according to claim 1, wherein
X is two,
Y is two, and
Z is two.

3. The code table generation device according to claim 1, wherein
the storage areas are an array in which each of the storage areas is identified by an index,
the leaf node queue range is specified by an index range of the array,
a leaf node read pointer indicative of the head of the leaf node queue range is configured to:
  in a case where the entries are sorted in ascending order of frequency of occurrence, indicate, in the initial state, a storage area storing a head entry among the sorted entries; and
  in a case where the entries are sorted in descending order of frequency of occurrence, indicate, in the initial state, a storage area storing a tail entry among the sorted entries,
an index indicative of a tail of the leaf node queue range is configured to:
  in a case where the entries are sorted in ascending order of frequency of occurrence, indicate, in the initial state, a storage area storing a tail entry among the sorted entries; and
  in a case where the entries are sorted in descending order of frequency of occurrence, indicate, in the initial state, a storage area storing a head entry among the sorted entries,
the intermediate node queue range is specified by an index range of the array,
an intermediate node read pointer indicative of the head of the intermediate node queue range is equal to the leaf node read pointer, in the initial state,
an intermediate node write pointer indicative of a tail of the intermediate node queue range is equal to the leaf node read pointer, in the initial state, and
the Huffman tree generation unit is configured to:
  select the Z nodes having smaller frequencies of occurrence from the X leaf nodes and the Y intermediate nodes, the X leaf nodes corresponding to X indexes from the leaf node read pointer in a direction approaching the tail of the leaf node queue range, the Y intermediate nodes corresponding to Y indexes from the intermediate node read pointer in a direction approaching the intermediate node write pointer;
  store the Z/2 intermediate nodes in Z/2 storage areas that correspond to Z/2 indexes from the intermediate node write pointer in a direction approaching the leaf node read pointer;
  update the leaf node read pointer with a value that is obtained by adding a number L of leaf nodes among the Z nodes to a value of the leaf node read pointer;
  update the intermediate node read pointer with a value that is obtained by adding a number M of intermediate nodes among the Z nodes to a value of the intermediate node read pointer; and
  update the intermediate node write pointer with a value that is obtained by adding Z/2 to a value of the intermediate node write pointer.

4. The code table generation device according to claim 3, wherein
X is two,
Y is two, and
Z is two.

5. The code table generation device according to claim 1, wherein
the storage areas is an array in which each of the storage areas is identified by an index,
the leaf node queue range is specified by an index range of the array,
an index indicative of the head of the leaf node queue range is configured to:
  in a case where the entries are sorted in ascending order of frequency of occurrence, indicate a storage area that stores, in the initial state, a head entry among the sorted entries; and
  in a case where the entries are sorted in descending order of frequency of occurrence, indicate a storage area that stores, in the initial state, a tail entry among the sorted entries,
an index indicative of a tail of the leaf node queue range is configured to:
  in a case where the entries are sorted in ascending order of frequency of occurrence, indicate a storage area storing a tail entry among the sorted entries; and
  in a case where the entries are sorted in descending order of frequency of occurrence, indicate a storage area storing a head entry among the sorted entries,
an intermediate node write pointer indicative of a location in the intermediate node queue range at which an intermediate node is to be stored indicates, in the initial state, an index indicative of the tail of the leaf node queue range, an index indicative of the head of the intermediate node queue range is equal to an index indicative of the tail of the leaf node queue range in the initial state, an index indicative of a tail of the intermediate node queue range is, in the initial state, same as the head of the intermediate node queue range, the Huffman tree generation unit is configured to:

select the Z nodes having smaller frequencies of occurrence from the X leaf nodes and the Y intermediate nodes, the X leaf nodes corresponding to X indexes from the head of the leaf node queue range in a direction approaching the tail of the leaf node queue range, the Y intermediate nodes corresponding to Y indexes from the head of the intermediate node queue range in a direction approaching the tail of the intermediate node queue range;

shift, based on a number L of leaf nodes among the Z nodes, all entries stored in the leaf node queue range by L indexes in a direction in which an entry including a smaller frequency of occurrence is stored;

store the Z/2 intermediate nodes in Z/2 storage areas that correspond to Z/2 indexes from the intermediate node write pointer in a direction approaching the tail of the leaf node queue range;

shift, based on a number M of intermediate nodes among the Z nodes, all entries stored in the intermediate node queue range by M indexes in a direction in which an entry including a smaller frequency of occurrence is stored; and update the intermediate node write pointer with a value that is obtained by adding (M−Z/2) to a value of the intermediate node write pointer, and the intermediate node queue range at least includes one or more storage areas that correspond to an index range from the head of the intermediate node queue range to the intermediate node write pointer.

6. The code table generation device according to claim 5, wherein

X is two,

Y is two, and

Z is two.

7. The code table generation device according to claim 1, wherein the Huffman tree is generated by using the child node information indicated by each of the Z/2 intermediate nodes.

8. A memory system comprising:

a nonvolatile memory; and a controller including the code table generation device according to claim 1, and an encoding unit, wherein the encoding unit is configured to convert the input symbols into codes, based on the code for each symbol determined by the code table generation device, and the controller is configured to write data that includes the codes, into the nonvolatile memory.

9. A code table generation method of controlling a code table generation device, the code table generation method comprising:

generating a frequency table based on a frequency of occurrence for each symbol of input symbols, the frequency table including entries each including a symbol and a frequency of occurrence;

sorting the entries in the frequency table by frequency of occurrence;

generating a Huffman tree having leaf nodes by using a queue that includes storage areas in which the sorted entries are respectively stored as the leaf nodes in an initial state, in response to the entries having been sorted;

determining a code length for each symbol of the symbols, based on the Huffman tree; and determining a code for each symbol of the symbols, based on the code length for each symbol, wherein each of the storage areas is capable of being allocated as either a leaf node queue range that stores a leaf node or an intermediate node queue range that stores an intermediate node, one or more storage areas allocated as the leaf node queue range are capable of storing one or more leaf nodes, respectively, in order from a head of the leaf node queue range, the one or more leaf nodes being arranged in ascending order of frequency of occurrence, one or more storage areas allocated as the intermediate node queue range are capable of storing one or more intermediate nodes, respectively, in order from a head of the intermediate node queue range, the one or more intermediate nodes being arranged in ascending order of frequency of occurrence, the code table generation method comprises:

selecting Z nodes having smaller frequencies of occurrence from X leaf nodes and Y intermediate nodes, the X leaf nodes being stored in X storage areas from the head of the leaf node queue range, the Y intermediate nodes being stored in Y storage areas from the head of the intermediate node queue range;

generating Z/2 intermediate nodes each having two nodes among the Z nodes as children;

allocating, as the intermediate node queue range, at least one storage area in the leaf node queue range that has become capable of being reallocated in response to at least one of the X leaf nodes having been selected as the Z nodes; and storing the Z/2 intermediate nodes in the intermediate node queue range in a first-in first-out manner, each of the stored Z/2 intermediate nodes indicates child node information related to the two nodes that are had as children and a sum of frequencies of occurrence of the respective two nodes that are had as children, X is an integer of one or more, Y is an integer of one or more, a sum of X and Y is larger than Z, and Z is an integer of two or more and a multiple of two.

10. The code table generation method according to claim 9, wherein

X is two,

Y is two, and

Z is two.

11. The code table generation method according to claim 9, wherein the storage areas are an array in which each of the storage areas is identified by an index, the leaf node queue range is specified by an index range of the array, a leaf node read pointer indicative of the head of the leaf node queue range is configured to:

in a case where the entries are sorted in ascending order of frequency of occurrence, indicate, in the initial state, a storage area storing a head entry among the sorted entries; and in a case where the entries are sorted in descending order of frequency of occurrence, indicate, in the initial state, a storage area storing a tail entry among the sorted entries, an index indicative of a tail of the leaf node queue range is configured to:
  in a case where the entries are sorted in ascending order of frequency of occurrence, indicate, in the initial state, a storage area storing a tail entry among the sorted entries; and
  in a case where the entries are sorted in descending order of frequency of occurrence, indicate, in the initial state, a storage area storing a head entry among the sorted entries, the intermediate node queue range is specified by an index range of the array, an intermediate node read pointer indicative of the head of the intermediate node queue range is equal to the leaf node read pointer, in the initial state, an intermediate node write pointer indicative of a tail of the intermediate node queue range is equal to the leaf node read pointer, in the initial state, and the code table generation method comprises:
  selecting the Z nodes having smaller frequencies of occurrence from the X leaf nodes and the Y intermediate nodes, the X leaf nodes corresponding to X indexes from the leaf node read pointer in a direction approaching the tail of the leaf node queue range, the Y intermediate nodes corresponding to Y indexes from the intermediate node read pointer in a direction approaching the intermediate node write pointer;
  storing the Z/2 intermediate nodes in Z/2 storage areas that correspond Z/2 indexes from the intermediate node write pointer in a direction approaching the leaf node read pointer;
  updating the leaf node read pointer with a value that is obtained by adding a number L of leaf nodes among the Z nodes to a value of the leaf node read pointer;
  updating the intermediate node read pointer with a value that is obtained by adding a number M of intermediate nodes among the Z nodes to a value of the intermediate node read pointer; and
  updating the intermediate node write pointer with a value that is obtained by adding Z/2 to a value of the intermediate node write pointer.

12. The code table generation method according to claim 11, wherein
X is two,
Y is two, and
Z is two.

13. The code table generation method according to claim 9, wherein
the storage areas are an array in which each of the storage areas is identified by an index,
the leaf node queue range is specified by an index range of the array,
an index indicative of the head of the leaf node queue range is configured to:
  in a case where the entries are sorted in ascending order of frequency of occurrence, indicate a storage area that stores, in the initial state, a head entry among the sorted entries; and
  in a case where the entries are sorted in descending order of frequency of occurrence, indicate a storage area that stores, in the initial state, a tail entry among the sorted entries, an index indicative of a tail of the leaf node queue range is configured to:
  in a case where the entries are sorted in ascending order of frequency of occurrence, indicate a storage area storing a tail entry among the sorted entries; and
  in a case where the entries are sorted in descending order of frequency of occurrence, indicate a storage area storing a head entry among the sorted entries, an intermediate node write pointer indicative of a location in the intermediate node queue range at which an intermediate node is to be stored indicates, in the initial state, an index indicative of the tail of the leaf node queue range, an index indicative of the head of the intermediate node queue range is equal to an index indicative of the tail of the leaf node queue range in the initial state, an index indicative of a tail of the intermediate node queue range is, in the initial state, same as the head of the intermediate node queue range, the code table generation method comprises:
  selecting the Z nodes having smaller frequencies of occurrence from the X leaf nodes and the Y intermediate nodes, the X leaf nodes corresponding to X indexes from the head of the leaf node queue range in a direction approaching the tail of the leaf node queue range, the Y intermediate nodes corresponding to Y indexes from the head of the intermediate node queue range in a direction approaching the tail of the intermediate node queue range;
  shifting, based on a number L of leaf nodes among the Z nodes, all entries stored in the leaf node queue range by L indexes in a direction in which an entry including a smaller frequency of occurrence is stored;
  storing the Z/2 intermediate nodes in Z/2 storage areas that correspond to Z/2 indexes from the intermediate node write pointer in a direction approaching the tail of the leaf node queue range;
  shifting, based on a number M of intermediate nodes among the Z nodes, all entries stored in the intermediate node queue range by M indexes in a direction in which an entry including a smaller frequency of occurrence is stored; and
  updating the intermediate node write pointer with a value that is obtained by adding (M−Z/2) to a value of the intermediate node write pointer, and
the intermediate node queue range at least includes one or more storage areas that correspond to an index range from the head of the intermediate node queue range to the intermediate node write pointer.

14. The code table generation method according to claim 13, wherein
X is two,
Y is two, and
Z is two.

15. The code table generation method according to claim 9, wherein
the Huffman tree is generated by using the child node information indicated by each of the Z/2 intermediate nodes.

* * * * *